US009343152B2

(12) United States Patent
Rhie

(10) Patent No.: US 9,343,152 B2
(45) Date of Patent: May 17, 2016

(54) CELL ARRAY WITH A MANUFACTURABLE SELECT GATE FOR A NONVOLATILE SEMICONDUCTOR MEMORY DEVICE

(71) Applicant: Conversant IP Management Inc., Ottawa (CA)

(72) Inventor: Hyoung Seub Rhie, Ottawa (CA)

(73) Assignee: CONVERSANT INTELLECTUAL PROPERTY MANAGEMENT INC., Ottawa (CA)

( * ) Notice: Subject to any disclaimer, the term of this patent is extended or adjusted under 35 U.S.C. 154(b) by 98 days.

(21) Appl. No.: 14/460,963

(22) Filed: Aug. 15, 2014

(65) Prior Publication Data

US 2015/0098274 A1 Apr. 9, 2015

Related U.S. Application Data

(60) Provisional application No. 61/887,865, filed on Oct. 7, 2013.

(51) Int. Cl.
*G11C 16/04* (2006.01)
*H01L 27/115* (2006.01)

(52) U.S. Cl.
CPC ........ *G11C 16/0483* (2013.01); *G11C 16/0416* (2013.01); *H01L 27/1157* (2013.01); *H01L 27/11578* (2013.01)

(58) Field of Classification Search
CPC .......... H01L 27/11551; H01L 27/11519; H01L 27/11521; H01L 27/11524; H01L 27/11565; H01L 27/11568; H01L 27/11557; H01L 27/11578; G11C 16/0433; G11C 16/0441; G11C 16/0483; G11C 16/0466
See application file for complete search history.

(56) References Cited

U.S. PATENT DOCUMENTS

| 8,837,216 B2 * | 9/2014 | Mokhlesi | H01L 21/28273 257/315 |
| 8,896,054 B2 * | 11/2014 | Sakuma | H01L 27/11519 257/314 |
| 9,236,127 B2 * | 1/2016 | Rhie | G11C 16/0483 |

(Continued)

FOREIGN PATENT DOCUMENTS

EP 1959454 A3 8/2008

OTHER PUBLICATIONS

Werner Bux, IBM Research, Performance Evaluation of the Write Operation In Flash-Based Solid-State Drives, Research Report, RZ 3757, (#99767), 29 pages, Nov. 23, 2009.

(Continued)

*Primary Examiner* — Allison P Bernstein
(74) *Attorney, Agent, or Firm* — Daniel Hammond

(57) ABSTRACT

A three-dimensional integrated circuit non-volatile memory array includes a memory array with first and second NAND memory cell string stacks having opposite orientations, where each NAND memory cell string includes a plurality of transistors and a source line contact connected in series between a bit line and string extension region which extends from the source line contact and past a first self-aligned SSL gate electrode located on a peripheral end of the NAND memory cell string, and also includes a string select transistor formed with a second self-aligned SSL connected in series between the bit line and the plurality of transistors, where the first and second self-aligned SSL gate electrodes are shared between adjacent NAND memory cell strings having opposite orientations.

17 Claims, 11 Drawing Sheets

(56) References Cited

U.S. PATENT DOCUMENTS

| | | |
|---|---|---|
| 2012/0181580 A1 | 7/2012 | Lue et al. |
| 2012/0181699 A1 | 7/2012 | Chen et al. |
| 2012/0182802 A1 | 7/2012 | Hung et al. |
| 2012/0182804 A1 | 7/2012 | Hung et al. |
| 2012/0182806 A1 | 7/2012 | Chen et al. |
| 2013/0003434 A1 | 1/2013 | Lue et al. |
| 2015/0071005 A1* | 3/2015 | Maejima ............... G11C 16/28 365/185.21 |

OTHER PUBLICATIONS

Kuo-Pin Chang et al., Memory Architecture of 3D Vertical Gate (3DVG) NAND Flash Using Plural Island-Gate SSL Decoding Method and Study of It's [sic] Program Inhibit Characteristics, 2012 4th IEEE International Memory Workshop, May 20-23, 2012.

Chih-Ping Chen et al., A Highly Pitch Scalable 3D Vertical Gate (VG) NAND Flash Decoded by a Novel Self-Aligned Independently Controlled Double Gate (IDG) String Select Transistor (SSL), 2012 IEEE Symposium on VLSI Technology Digest of Technical Papers.

Shih-Hung Chen et al., A Highly Scalable 8-layer Vertical Gate 3D NAND with Split-page Bit Line Layout and Efficient Binary-sum MiLC (Minimal Incremental Layer Cost) Staircase Contacts, 2012 IEEE International Electron Devices Meeting (IEDM), Dec. 10-13, 2012.

Yoshiaki Fukuzumi et al., Optimal Integration and Characteristics of Vertical Array Devices for Ultra-High Density, Bit-Cost Scalable Flash Memory, IEEE International Electron Devices Meeting, Dec. 10-12, 2007.

X. Y. Hu et al., IBM Research, The Fundamental Limit of Flash Random Write Performance: Understanding, Analysis and Performance Modelling, Research Report, RZ 3771, (#99781), 15 pages, Mar. 31, 2010.

A. Hubert et al., A stacked SONOS technology, up to 4 levels and 6nm crystalline nanowires, with gate-all-around or independent gates ($\phi$-Flash), suitable for full 3D integration, IEEE 2009.

Chun-Hsiung Hung, Design Innovations to Optimize the 3D Stackable Vertical Gate (VG) NAND Flash, 2012 IEEE International Electron Devices Meeting (IEDM), Dec. 10-13, 2012.

Ashish Jagmohan et al., Write Amplification Reduction in NAND Flash through Multi-Write Coding, 2010 IEEE 26th Symposium on Mass Storage Systems and Technologies (MSST), May 3-7, 2010.

Jaehoon Jang et al., Vertical Cell Array using TCAT(Terabit Cell Array Transistor) Technology for Ultra High Density NAND Flash Memory, IEEE 2009 Symposium on VLSI Technology Digest of Technical Papers, 2009.

Yoon Kim et al., Three-Dimensional NAND Flash Architecture Design Based on Single-Crystalline STacked ARray, IEEE Transactions on Electron Devices, vol. 59, No. 1, Jan. 2012.

Hang-Ting Lue et al., A Novel Junction-Free BE-SONOS NAND Flash, IEEE 2008 Symposium on VLSI Technology Digest of Technical Papers, 2008.

Hang-Ting Lue et al., Highly Scalable 8-Layer 3D Vertical-Gate (VG) TFT NAND Flash Using Junction-Free Buried Channel BE-SONOS Device, 2010 Symposium on VLSI Technology Digest of Technical Papers, 2010.

R. Micheloni et al., NAND overview: from memory to systems, Chapter 2, Inside NAND Flash Memories, ISBN: 978-90-481-9430-8, 2010.

H. Tanaka et al., Bit Cost Scalable Technology with Punch and Plug Process for Ultra High Density Flash Memory, 2007 Symposium on VLSI Technology Digest of Technical Papers, 2007.

Hyoung Seub Rhie, U.S. Appl. No. 13/829,392, filed Mar. 14, 2013, entitled Structure And Method For Manufacture Of Memory Device With Thin Silicon Body.

* cited by examiner

10A

10B

CELL ARRAY WITH A MANUFACTURABLE SELECT GATE FOR A NONVOLATILE SEMICONDUCTOR MEMORY DEVICE

BACKGROUND OF THE INVENTION

1. Field of the Invention

The present invention is directed in general to integrated circuit devices and methods for manufacturing same. In one aspect, the present invention relates to nonvolatile memory devices, such as NAND flash memory and other types of flash memory.

2. Description of the Related Art

With the increasing demand for nonvolatile data storage in consumer electronics having mass storage, such as video or audio players, digital cameras, and other computerized devices, there continues to be interest in having nonvolatile memory devices progress over time towards having smaller sizes, larger memory capacity, and improved performance. Flash memory is a commonly used type of nonvolatile memory which can take the form of memory cards or USB type memory sticks, each having at least one memory device and a memory controller formed therein. For example, the need to reduce manufacturing costs per data bit is driving the NAND flash industry to continuously reduce the size of the cell transistors. But as fabrication process limitations (for example, limitations imposed by photolithography tools) limit the ability to reduce physical transistor sizes, there have been structural and/or design schemes proposed to increase memory density, such as, for example, stacking NAND cells in a direction perpendicular to the chip surface, thereby reducing the effective chip area per data bit without requiring shrinkage of the physical cell transistor size. However, there continue to be challenges associated with designing, fabricating, and operating vertical NAND flash memory devices.

BRIEF DESCRIPTION OF THE DRAWINGS

The present invention may be understood, and its numerous objects, features and advantages obtained, when the following detailed description is considered in conjunction with the following drawings, in which:

FIG. 1b illustrates a simplified cross sectional view of the NAND flash memory cell transistors shown in FIG. 1a;

Figure 1A:
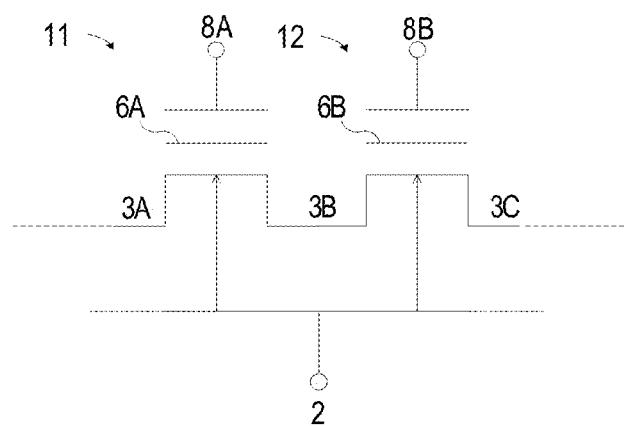
FIG. 1a illustrates a simplified circuit schematic representation of two serially-connected NAND flash memory cell transistors.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

In a three-dimensional vertical gate NAND flash memory device, a stacked memory architecture and cell array structure are provided to enable node isolation using self-aligned string select line (SSL) gates that are positioned on first and second peripheral ends of a plurality of NAND strings having alternating or opposed string orientations. In selected embodiments, self-aligned SSL gates are patterned and positioned on opposite ends of adjacent strings having opposed orientations so that a first string having a first bit line end-to-source line end orientation includes one or more first self-aligned SSL gates located on a bit line end of the first string, while a second, adjacent string having an opposite bit line end-to-source line end orientation includes one or more second self-aligned SSL gates located on a bit line end of the second string. By positioning each string's source contact inside the self-aligned SSL gate location for each adjacent string so that the source contact for a string is longitudinally located between the string's word lines and the adjacent string's SSL gate location, each string includes an electrically floating string section or stub which extends past the self-aligned SSL gates for each adjacent string and may be used in the formation of the self-aligned SSL gates. The positioning of the source contact inside the self-aligned SSL gate location for each adjacent string also provides each string with a transistor cell section which extends from the source contact to the bit line. As a result, a string select line signal applied to the first self-aligned SSL gate(s) will select the first string without also selecting the second string. By the same token, a string select line signal applied to the second self-aligned SSL gate(s) will select the second string without also selecting the first string.

In this disclosure, an improved system, apparatus, and fabrication method are described for fabricating vertical gate NAND flash memory devices with self-aligned SSL gates positioned on opposing ends of adjacent NAND strings having alternating string orientations, that address various problems in the art where various limitations and disadvantages of conventional solutions and technologies will become apparent to one of skill in the art after reviewing the remainder of the present application with reference to the drawings and detailed description provided herein. For example, there are manufacturing challenges with isolating adjacent SSL gates imposed by limits of the photolithographic patterning used to form separate island-type SSL gates. While there have been attempts to address such limitations by using self-aligned patterning to form SSL gates, such SSL gate structures introduce other technical challenges when applying an SSL selection signal to select a specific string since the same SSL selection signal can also select an adjacent string sharing a common self-aligned SSL gate node with the intended string. Various illustrative embodiments of the present invention will now be described in detail with reference to the accompanying figures. While various details are set forth in the following description, it will be appreciated that the present invention may be practiced without these specific details, and that numerous implementation-specific modifications may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified drawings and representations of a flash memory device without including every device feature, geometry, or circuit detail in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art how to make or use the present invention.

To provide a contextual framework for selected embodiments of the present disclosure, reference is now made to FIG. 1a which illustrates a simplified circuit schematic representation 1 of two serially connected NAND Flash cell transistors 11, 12. Each of the transistors 11, 12 includes a control gate 8A, 8B and a floating node (or storage nodes) 6A, 6B. Source/drain nodes 3A, 3B, 3C and the cell body node 2 are also shown. The NAND flash memory cell transistors 11, 12 can perform erase, program, and read operations by applying appropriate voltages to the indicated nodes, thereby trapping electrons in the charge storage nodes 6A, 6B to modify the threshold voltage of each cell transistor to different levels, depending on the data (0 or 1) stored in the cell. The threshold voltage of each cell transistor determines the resistance of the corresponding channel 4A, 4B. In selected embodiments where each NAND Flash memory cell stores two logic states (data '1' and data '0'), each memory cell corresponds to one bit, but in other embodiments where NAND Flash memory cells can be programmed to four or more threshold levels, multiple bits can be stored in each physical cell, which is referred to as a multi-level cell (MLC). With NAND flash memory cells, data is typically erased and programmed using Fowler-Nordheim (F-N) tunneling to deliver or remove charge from the floating gate/charge storage nodes 6A, 6B by applying a suitably large voltage to the control gate 8A, 8B (for example, 20V) while holding the substrate 2 and source/drain regions 3 to a lower voltage (for example, ground or 0V) to induce the formation of a channel 4A, 4B under the tunnel dielectric 5 which injects electrons into the floating gate/charge storage nodes 6A, 6B. As a result, the cell threshold voltage Vth of the programmed cell is shifted in the positive direction.

In order to read cell data, the control gate 8A, 8B is biased to a lower voltage (for example, Vss=0V). If the cell is in an erased state, the erased cell has a negative threshold voltage so that the cell current (Icell) from the drain 3B to the source 3A flows under the given read bias condition. On the other hand, if the cell is in a programmed state, the programmed cell has a positive threshold voltage so that there is no cell current from the drain 3B to the source 3A under read bias condition. An erased cell (on-cell) is thus read or sensed as data '1' and a programmed cell (off-cell) is read or sensed as data '0'.

During an erase operation, the control gate 8A, 8B of a cell is biased to a low voltage (for example, Vss=0V) while the cell body 2 is biased to an erase voltage V_erase (for example 18 V) and the source and drain 3A/3B of the cell are floated. In the erase bias conditions, no conductive inversion layer channel 4A, 4B of n-type conductivity exists because the cell transistors are strongly turned off, in which case the trapped electrons in the floating node 6A, 6B are emitted uniformly to the substrate 2 through the tunnel dielectric 5. As a result, the cell threshold voltage (Vth) of the erased cell becomes negative. In other words, the erased cell transistor is in an on-state if the gate bias of the control gate is 0V. Because of the cell body bias requirement for erase bias conditions, erase operations are not applied to individual NAND Flash memory cells, but are instead applied to erase entire blocks of cells.

Figure 1B:
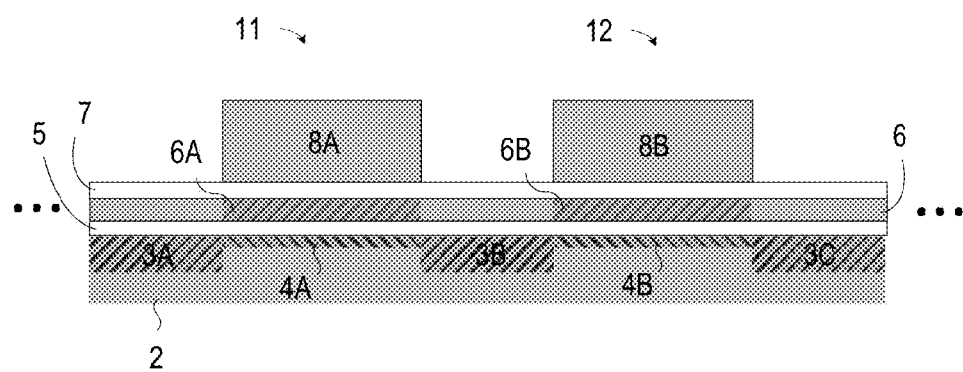

To further illustrate the contextual framework for selected embodiments of the present disclosure, reference is now made to FIG. 1b which illustrates a simplified cross sectional view of the NAND flash memory cell transistors 11, 12 shown in FIG. 1a formed in a semiconductor substrate or string structure. The illustrated NAND Flash cell includes a semiconductor body or well layer 2 formed with an appropriate semiconductor material (for example, monocrystalline or polycrystalline silicon) having a first polarity type (for example, p-type silicon), such as a bulk semiconductor substrate, semiconductor-on-insulator (SOI) substrate, or a polysilicon layer. Multiple semiconductor substrate or string structures can be vertically stacked over a bulk or SOI substrate and separated from one another by interlayer dielectric layers.

On or around the semiconductor body or well layer 2, a multi-layered memory film structure 5-7 is formed for each transistor 11, 12, including a tunnel dielectric layer 5 that is formed (for example, deposited or grown) on the semiconductor body/well layer 2, a charge storage layer 6 that is formed on the tunnel dielectric 5, and a coupling dielectric 7 (a.k.a., blocking dielectric) that is formed (for example, deposited) on the charge storage layer 6. Sandwiched between the tunnel dielectric layer 5 and the coupling dielectric layer 7, the charge storage layer 6 performs a charge trap function by including charge storage nodes or locations 6A, 6B where electrons are trapped. In selected embodiments, the charge storage nodes 6A, 6B may be formed as a SONOS (Silicon-Oxide-Nitride-Oxide-Silicon) structure, though other charge storage node structures may be used. As will be appreciated, the charge storage nodes 6A, 6B are formed to prevent unintentional charge flow between adjacent cells, such as by forming the charge storage layer 6 with dielectric charge trapping material or with conductive material in each cell which is isolated from adjacent cells (e.g., by patterned dielectric layers between adjacent floating gates). In selected floating gate embodiments (not shown), the charge storage layer 6 is patterned into separate floating gates that are isolated from one another. However, in embodiments where the charge storage layer 6 and storage nodes 6A, 6B are formed as a single continuous layer, the multi-layered memory film structure 5-7 may be fabricated as a continuous thin film without patterned, isolated segments. On the multi-layered memory film structure 5-7, patterned control gates 8A, 8B are formed, such as by depositing a polysilicon layer or other conductive control gate layer on the coupling dielectric 7.

In the semiconductor body/well layer 2, source/drain regions 3A-3C are formed using any desired technique. For example, the source/drain regions 3 may be formed by implanting or diffusing regions with appropriate polarity dopants (for example, n-type doping). In other embodiments, the source/drain regions 3 are not formed as permanently conducting implant regions, but instead have their conductivity controlled by applying electric fringe-fields from the control gates 8A, 8B. For example, a large bias applied at the control gates 8A, 8B can induce conductive inversion layers in the source/drain regions 3A-3C in the same manner as a channel inversion layer forms when a transistor is turned on. These types of cells are called "junction-free" or "junctionless" cells. In such junction-free cells, the channel regions 4A, 4B and the source/drain regions 3A, 3B, 3C are only conductive if the electric field between the charge storage node 6A, 6B and the substrate 2 is sufficiently large to induce an inversion layer. This electric field is caused by a combination of the charge stored in the charge storage layer 6A, 6B and the external bias that is applied to the control gate 8A, 8B.

Figure 2:
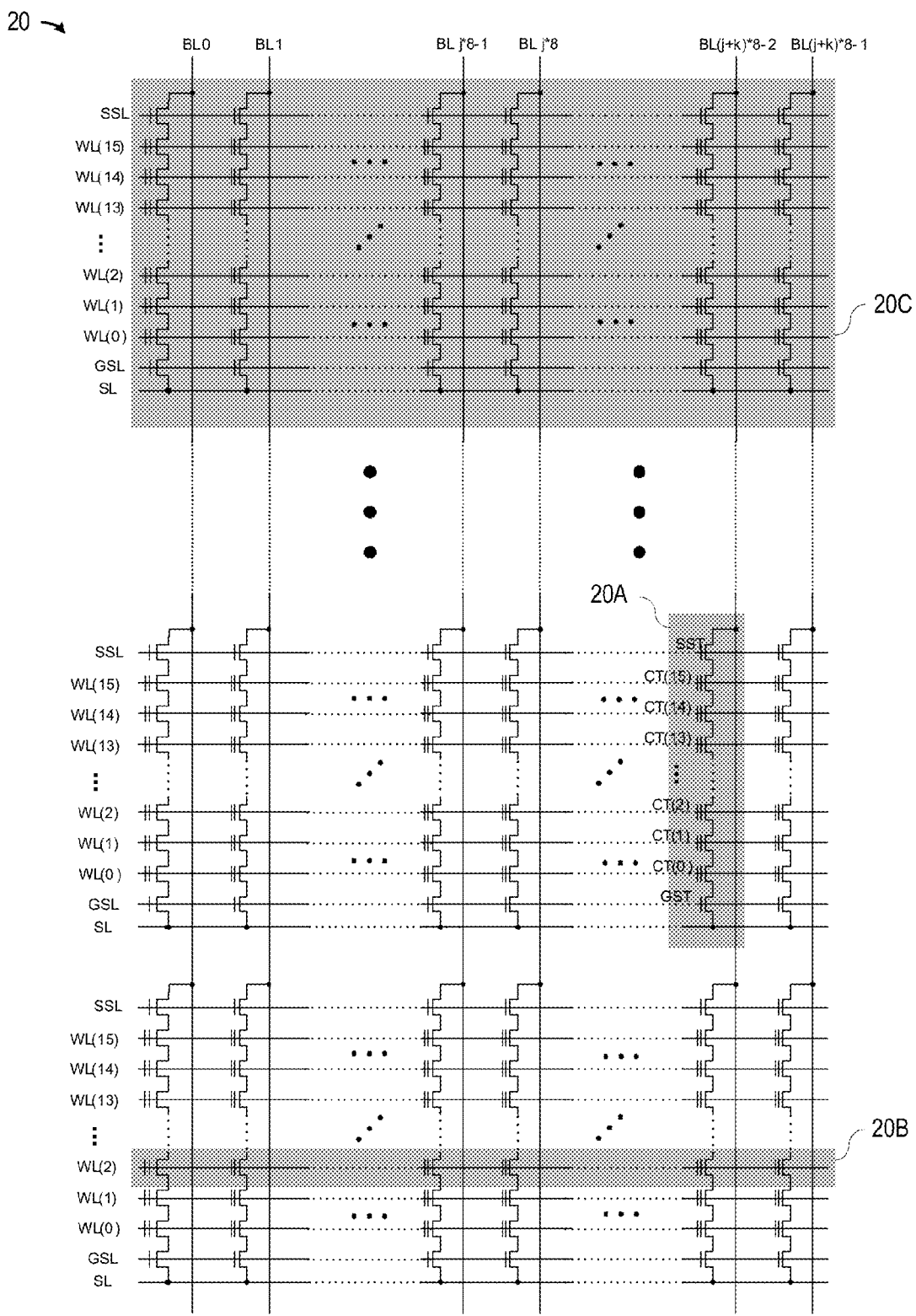
FIG. 2 illustrates a simplified circuit schematic representation of a NAND flash memory cell array in which a string, page, and block of data are identified.

Turning now to FIG. 2, there is shown a simplified circuit schematic of a plurality of NAND flash memory cells organized and arrayed into multiple rows and columns, where each column is connected to a respective bit line conductor (for example, BL0–BL(j+k)*8−1) and each row is connected to a respective word line conductor (for example, WL(0)-WL(15)). As depicted, the NAND flash memory cell array 20 can be subdivided into data strings, data pages, and data blocks, as illustrated by examples of a data string 20A, data page 20B, and data block 20C.

In the depicted NAND string 20A, the cells are connected in series in a group of a predetermined numbers of cells (for example, 16, 32 or 64). To connect each string to its corresponding source line (SL) and bit line (for example, BL(j+k)*8−2), selection transistors are placed at the edges of the string. For example, the NAND cell string 20A includes at least one string select transistor (SST, SSL gate or SSL transistor) and at least one ground select transistor (GST, GSL gate or GSL transistor). The gate of the string select transistor (SST) is connected to a string select line (SSL), while the drain of a string select transistor (SST) is connected to a bit line for the string (for example, BL(j+k)*8−2). The gate of a ground select transistor (GST) is connected to a ground select line (GSL), while the source of the ground select transistor (GST) is connected to a source line (SL or CSL) for the string. Connected in series between the string select transistor SST and ground select transistor GST is a plurality of memory cell transistors CT(i), each having a control gate connected to a respective word line WL(i). In the depicted configuration, the NAND string 20A shares the bit line contact with another string, and any desired number of memory cell transistors may be connected in a string so that the number of cells per string may vary with 4 cells per string, 8 cells per string, 16 cells per string, 32 cells per string, 64 cells per string, 128 cells per string, and so on. To specify a direction within the string 20A, the direction towards the string select line SSL of a string is referred to as "drain direction" or "drain side," and the direction towards the ground select line GSL of a string is referred to as "source direction" or "source side."

In the depicted NAND page 20B, the cells are addressed by a row address to specify the smallest unit of cells for which a read or program operation can be performed. In selected embodiments, the page 20B includes the cells connected to the same word line (for example, WL(2)). In other embodiments, the number of pages per word line depends upon the storage capabilities of the memory cell. For example, the cells connected to a certain word line may be subdivided into multiple subgroups so that the array 20 includes multiple pages per word line, whereby each one of the multiple pages in one word line has a different row address. In the case of multiple bit storage in one physical cell, different bits can belong to different pages logically although they are physically located in the same cell transistor and thus connected to the same word line.

The NAND Flash array 20 may also be grouped into a series of blocks (for example, 20C). For example, the depicted NAND flash block 20C includes all strings which share the same word lines, string select lines, and ground select lines. Stated another way, a block 20C includes all pages sharing the same string select lines and ground select lines. In other embodiments, different groupings of NAND flash cells may be used for the flash erase blocks. In selected embodiments, the smallest unit for which an erase operation is performed is one cell block, which is therefore often named "erase block."

Figure 3:
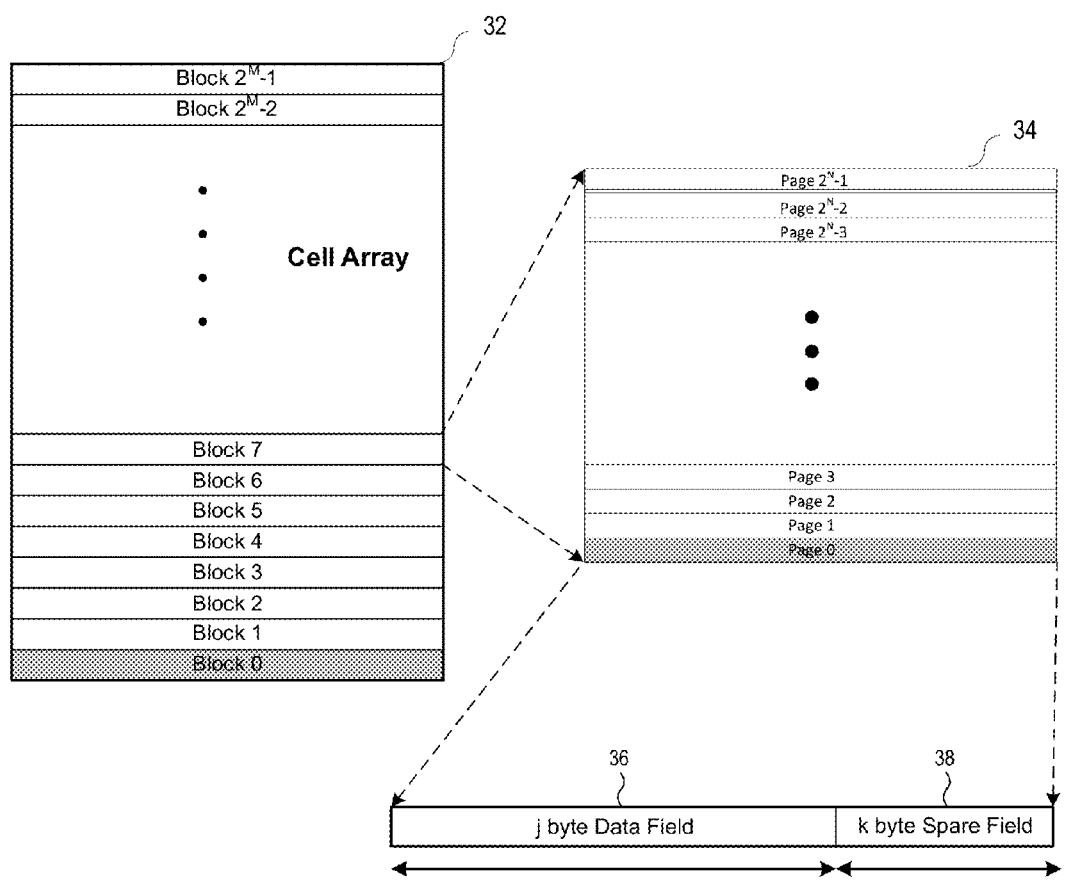
FIG. 3 illustrates a multi-block NAND flash cell array memory using block and page addressing to support read, program, and erase operations.

To illustrate the block-base erase operations for a NAND flash array, reference is now made to FIG. 3 which shows a multi-block NAND flash memory 30 which uses block and page addressing to support read, program, and erase operations. As depicted, the flash memory 30 is organizationally divided in blocks 32 and pages 34. The depicted flash memory 30 includes $2^M$ blocks, though more generally, there may be power of two blocks within any flash memory. Each block (for example, Block 7) contains multiple pages 34 which are typically a multiple of 8 (for example 64, 128), though more generally, there may be $2^N$ pages in each block. Again, a page is the smallest addressable unit for reading and writing, and may include a main area for storing data and a spare area for error correction, system pointers, and/or other information relating to the data stored in the main area. Assuming that the row address contains M bits for the block address and N bits for the page address, the multi-block NAND flash memory 30 includes $2^M$ erase blocks, with each block subdivided into $2^N$ programmable pages. Each page (for example, Page 0) includes (j+k) bytes (times 8 bits) which are divided into a j-byte data storage region or data field 36 and a separate k-byte area or spare field 38 which is typically used for error management functions. As seen in the embodiment of FIG. 3, one page=(j+k) bytes, one block=$2^M$ pages=(j+k) bytes*$2^M$, and the total memory array size=$2^N$ blocks=(j+k) bytes*$2^{M+N}$.

Figure 4:
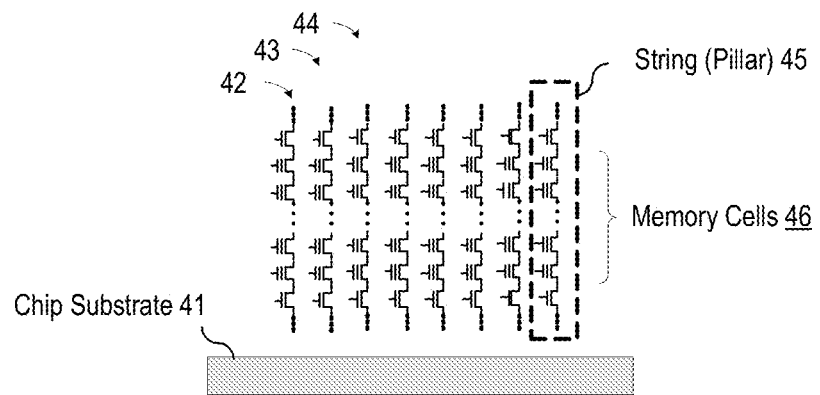
FIG. 4 illustrates a simplified cross-sectional schematic representation of a vertically stacked array of vertical channel NAND flash cell strings formed over a substrate.
Figure 5:
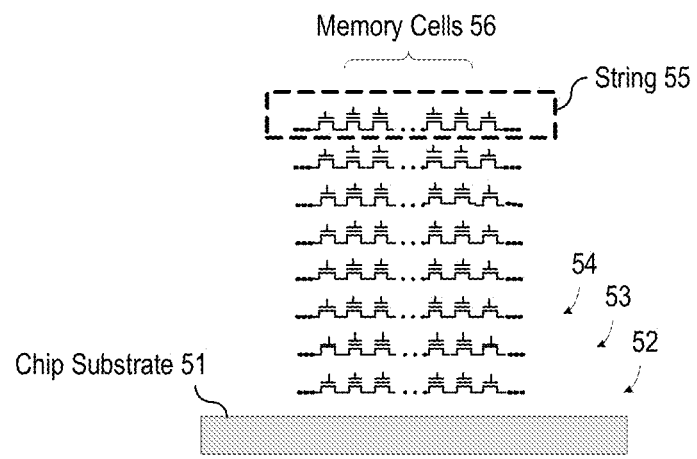
FIG. 5 illustrates a simplified cross-sectional schematic representation of a vertically stacked array of vertical gate NAND flash cell strings formed over a substrate.

As memory array sizes increase, the need to reduce manufacturing costs per data bit is driving the NAND Flash industry to continuously reduce the size of the cell transistors. Due to the limitations imposed by photolithography tools and the limits of shrinking the physical transistor size, schemes have been proposed whereby NAND cells are stacked in a direction perpendicular to the chip surface. Thereby, the effective chip area per data bit can be reduced without relying on the shrinkage of the physical cell transistor size. Generally speaking, there are two main types of stacked NAND flash memory device architectures. First, and as illustrated in simplified cross-sectional schematic form in FIG. 4, a vertically stacked array 40 may be fabricated with vertical channel NAND flash cell strings 42-45 formed over a substrate 41 to run in a direction that is perpendicular or orthogonal to the chip substrate 41. In the vertical channel NAND architecture, the memory cells 46 belonging to the same string are stacked vertically on top of each other, and different strings 42-45 are arranged as pillars that are laterally positioned next to one another. By convention, the device architecture for the vertically stacked array 40 may be referred to as Vertical Channel NAND or VC NAND. Second, and as illustrated in simplified cross-sectional schematic form in FIG. 5, a vertically stacked array 50 may be fabricated with vertical gate NAND flash cell strings 52-55 formed over a substrate 51 to run in a direction that is parallel to the chip substrate 51. In the VG NAND architecture, memory cells 56 belonging to the same string (for example, 52) are aligned in a direction parallel to the chip surface as in conventional NAND cells, but additional strings (for example, 53-55) are stacked vertically on top of each other. By convention, the device architecture for the vertically stacked array 50 may be referred to as Vertical Gate NAND or VG NAND.

Figure 6:
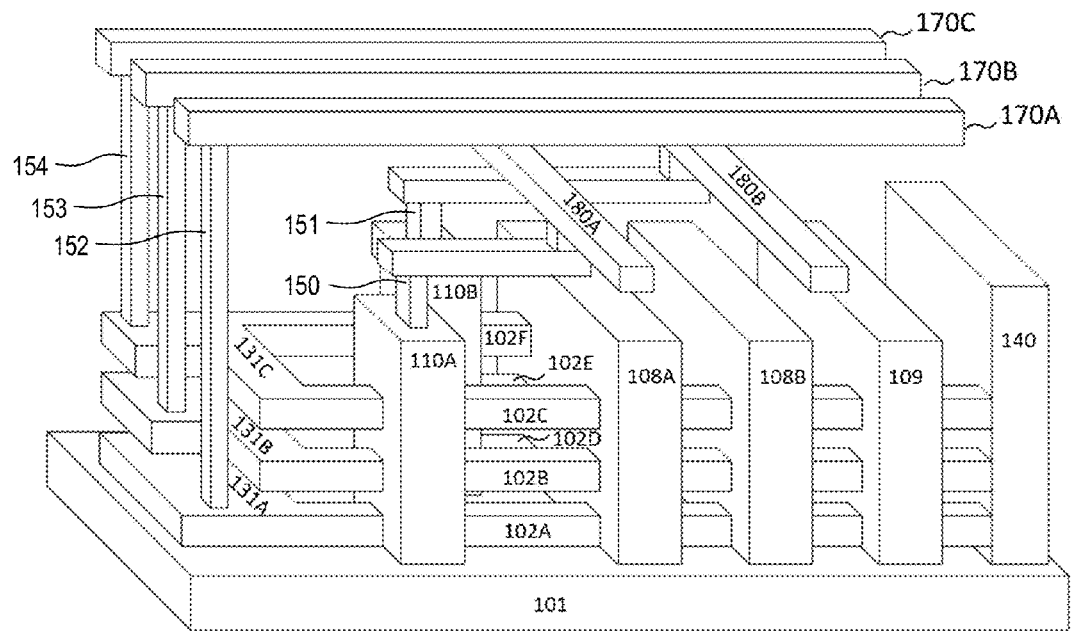
FIG. 6 illustrates a simplified schematic diagram of a three-dimensional vertical gate NAND flash memory array architecture using adjacent island-type string select transistors for adjacent stacks of vertical gate NAND flash cell strings.

Turning now to FIG. 6, there is shown a three-dimensional array architecture of a vertical gate NAND flash memory 100 with island-type string select transistors 110A, 110B for selecting different string stacks 102A-C, 102D-F. In the VG NAND flash memory 100, a plurality of stacked cell strings 102A-F are formed over a chip substrate 101 to extend through separate word line gate structures 108A, 108B, with each cell string running in a direction that is parallel to the surface of the chip substrate 101. The layout of the VG NAND 100 resembles a conventional NAND memory, but with word lines and bit lines grouped in each plane and with string select transistors connecting each string to a corresponding bit line pad 131. As shown, each NAND string is formed with a silicon strip (for example, patterned poly layer 102A) in which channels are formed to run in a horizontal direction that is parallel to the chip surface, with different NAND strings (for example, patterned poly layers 102B, 102C) stacked on top of each other. In the illustrated example, the cell transistors formed along each silicon strip (for example, 102A-C) are formed as dual gate devices by forming a word line gate structure 108A, 108B with multi-layered memory film structure to surround the silicon strip with opposing gates where each cell channel is formed. Though not separately shown, it will be appreciated that each multi-layered memory film structure formed around each string for each memory cell transistor may include a tunnel dielectric layer formed to surround the channel region of the silicon strip, a charge storage layer (for example, ONO) formed around the tunnel dielectric layer, and a coupling dielectric formed around the charge storage layer. Around each multi-layered memory film structure, a word line gate structure 108A, 108B may be formed with one or more patterned polysilicon layers to extend across multiple strings. To improve the conductivity of the poly word line gate structures 108A, 108B, a silicide layer (not shown), for example a tungsten silicide layer, may be formed at a contact surface. In addition, the transistors formed in each silicon strip may include implanted and/or diffused source/drain regions (for example, n+ regions) on at least the string select transistor and ground select transistor, if not also the memory cell transistors. In other embodiments, the memory cell transistors may be formed as junction-free cells with virtual source/drain regions formed to have conductivity that depends on the existence of electric fringe fields between gates adjacent to the source/drain regions and the source/drain silicon itself.

In addition to the separate word line gate structures 108A, 108B defining multiple memory cells, each string also includes additional gate structures on each end of the string to define ground and string select line transistors. As shown, the ground select line transistors may be formed with a poly gate structure 109 (and optional silicide layer) which connects the source node of each stacked string 102A-F to a shared or common source line 150, while string select transistors may be formed with separate poly gate structures 110A, 110B, each of which connects the drain nodes of vertically stacked strings 102A-F to a corresponding bit line pad 131A-C under control of a string select signal applied via metal line conductors 180A, 180B and contacts 150, 151. In this way, the source node of each string is shared with adjacent strings that are located above or below it in a vertical direction via a source contact using the common source line 150, but the drain node of each string (e.g., 102C) is shared only horizontally with other strings (e.g., 102F) via a bit line pad (e.g., 131C), but not vertically. If desired, the ground and string select transistors may be formed as dual gate devices substantially as described above. For example, the string select transistor at the drain node of each string may be formed with a poly gate structure (for example, 110A, 110B) and optional silicide layer (not shown) formed around a multi-layered memory film structure, while the ground select transistor at the source node of each string may be formed with a poly gate structure 109 formed around a multi-layered memory film structure.

By forming each word line gate structure 108A-B around the multi-layered memory film structures to extend horizontally across separate vertical stacks of silicon strips (for example, 102A-C and 102D-F), separate word line (WLi) signals may be connected to each poly gate node 108A-B of the cell transistors in a horizontal or lateral direction. In addition, each cell transistor shares its poly gate node 108A-B (and applied word line WLi signal) with all cell transistors that are stacked vertically above it. Bit lines can also be shared by one or more strings formed in the same layer (for example, 102A, 102D) by connecting the strings to a shared bit line pad (for example, 131A) which is used to establish electrical connection from the connected strings to the common bit line (for example, 170A) through one or more via contacts or conductors 152. In similar fashion, strings formed in another layer (for example, 102B, 102D) may be connected to a shared bit line pad (for example, 131B) which is electrically connected to a second common bit line (for example, 170B) through one or more via contacts or conductors 153, while strings formed in another layer (for example, 102C, 102E) may be connected to a shared bit line pad (for example, 131C) which is electrically connected to another common bit line (for example, 170C) through one or more via contacts or conductors 154.

Extending across all stacked cell strings 102A-C and 102D-F, the poly gate structure 109 for the shared ground select transistor connects the source nodes of stacked strings 102A-C and 102D-F to the common source line contact 150. In contrast, each poly gate structure 110A, 110B for a given string select transistor does not extend across multiple strings in the same plane, but is instead formed as an island SSL gate (e.g., 110A), so that each string (for example 102A) shares a common SSL gate (for example, 110A) with the vertically stacked strings (for example, 102B, 102C), but not any strings (for example, 102D) in the same plane.

The depicted vertical gate NAND flash memory 100 illustrates selected example embodiments for a three-dimensional array architecture of a vertical gate NAND flash memory which allows individual pages to be selected for read and program operation and which may erase selected blocks in a VG NAND structure. However, it will be appreciated that a vertical gate NAND flash memory may be implemented with different features and structures. For example, the common source line contact 150 may be formed with a different shape or structure, such as a using a plate-shaped layer and/or a conductive line that runs in a horizontal direction and connects vertically to an additional metal line which runs in a horizontal direction. In addition, the arrangement and connection of stacked cell strings 102A-F may be oriented to all run in the same direction, to run alternating strings in opposite directions, or with any desired orientation of different strings. In addition, any desired alignment, shape, and positioning of the island-type string select poly gate structures (for example, 110A, 110B) and/or bit line pads (for example, 131A-C) may be used to establish electrical connection to the metal layers 170A-C through respective via contacts 152-154.

As will be appreciated, the vertical gate NAND flash memory 100 shown in FIG. 6 shows conductive elements, such as interconnections, contacts, string bodies and gate material, to highlight the connectivity of the constituting elements, but not isolating materials such as gate dielectrics, interlayer dielectrics, inter-metal dielectrics, etc. Persons skilled in the art will understand that dielectric layers are located around the conductor elements to provide electrical isolation.

With three-dimensional vertical gate NAND flash memory array architectures, conventional decoding approaches for addressing individual cells (at the intersection of a one-dimensional word line and bit line) cannot be readily applied for a variety of reasons. For example, VG NAND word line nodes cannot be vertically isolated without substantial processing cost increases over the one-step photolithography process used to form word lines. In addition, vertical gate NAND flash memory array architectures typically require that bit lines be shared between NAND strings from different layers in order to reduce process complexity and save chip area, in which case the intersection of a word line and bit line is not sufficient to address an individual cell. There are also manufacturing challenges with forming island-type string select transistors 110A, 110B which are isolated from one another due to limits of photolithographic patterning. And while there have been attempts to address such limitations by using self-aligned patterning to form SSL gates, such self-aligned SLL gate structures introduce other technical challenges that result from the fact that each self-aligned SSL gate is in fact divided into two spatially separate gate elements, each of which is located between two adjacent string stacks and is electrically isolated from adjacent SSL gate elements by said string stacks. As a result, an SSL selection signal that is applied to select a string is applied to SSL gate elements on either side of the string to be selected. As a result, if two separate SSL gate elements are selected to select a string between them, adjacent strings on the other side of the entities are half-selected. Attempts to prevent such half selection have resulted in complicated biasing schemes which apply different voltages on each separate SSL gate element for a half-selected string so that the voltages compensate each other in a way that no string current flows except in selected strings. As a result, a cell array structure and associated fabrication method is required for a vertical gate NAND flash memory array having multiple NAND string stacks which share one or more fin-shaped poly gate word lines and use self-aligned string select line transistors to uniquely select a NAND string stack from among vertically stacked strings in different vertical layers.

Figure 7A:
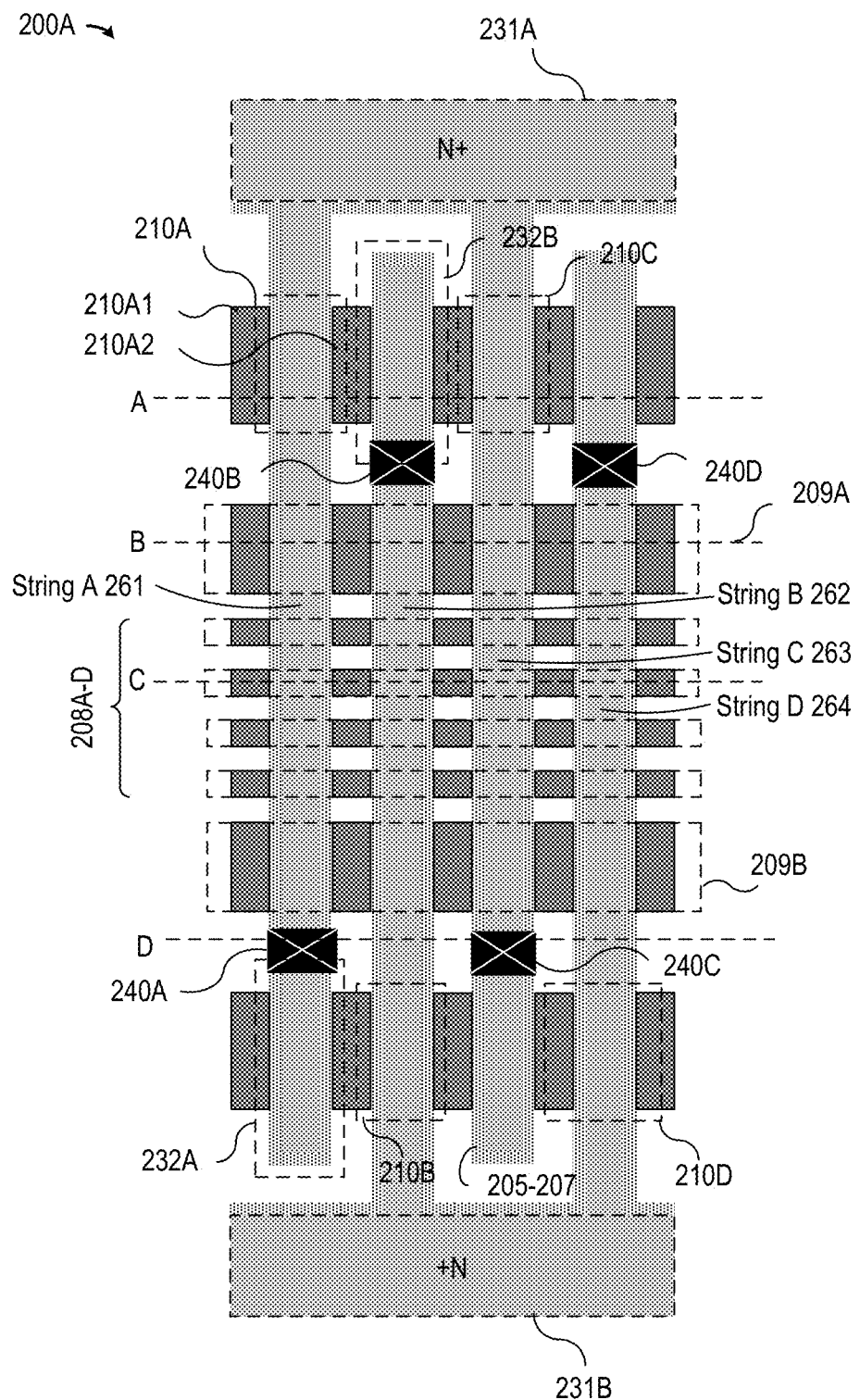
FIG. 7A illustrates a partial plan view of a vertical gate NAND flash memory cell array in accordance with selected embodiments of the present disclosure.
Figure 7B:
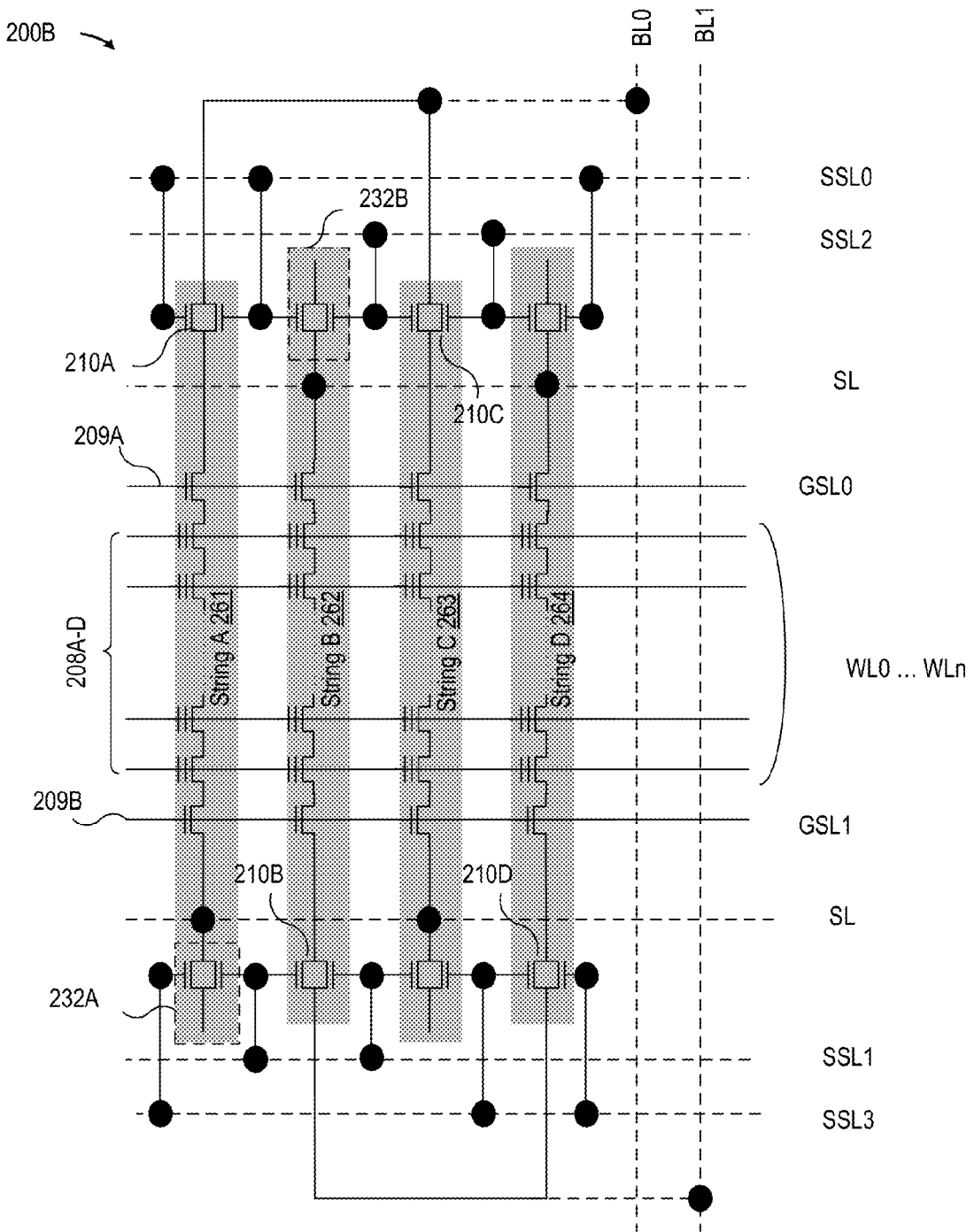
FIG. 7B illustrates a simplified circuit schematic diagram representation illustrating the electrical connectivity of a single layer in the vertical gate NAND flash memory cell array shown in FIG. 7A.

In accordance with selected embodiments disclosed herein, an improved vertical gate NAND flash memory array architecture and associated method of operation are disclosed which provide the ability to select individual strings and pages for read and program operation using self-aligned SSL transistor gates formed between adjacent NAND strings with alternating or opposed orientations. Selected example embodiments of a vertical gate NAND flash memory cell array are illustrated in FIGS. 7A and 7B with plan view 200A and schematic view 200B. In FIG. 7A, there is shown a partial plan view of a vertical gate NAND flash memory cell array 200A along a longitudinal section horizontal to the chip surface to illustrate how self-aligned SSL gates 210A, 210B, 210C, 210D are patterned and positioned on opposite ends of adjacent strings (String A, String B, String C, String D) that have alternating orientations and that are interleaved with one another. In particular, one or more first strings (String A, String C) that are connected between a shared bit line pad 231A and a corresponding source line contact 240A, 240C have a first bit line end-to-source line end orientation with one or more first self-aligned SSL gates 210A, 210C located on a bit line end of each first string. Interleaved with the first string(s) are one or more second, adjacent strings (String B, String D) that are connected between a shared bit line pad 231B and a corresponding source line contact 240B, 240D to provide an opposite bit line end-to-source line end orientation with one or more second self-aligned SSL gates 210B, 210D located on a bit line end of each second string.

As depicted in FIG. 7A, the vertical gate NAND flash memory cell array 200A includes multiple strings (for example, Strings A-D) with laterally disposed string bodies (for example, 202A to 202D shown in FIGS. 8-9) surrounded on opposing sides by multilayered memory film structures 205-207 which may include a tunnel dielectric layer, a charge storage layer (for example, ONO), and a blocking dielectric layer. Additional string bodies (for example, 202E-F shown in FIGS. 8-9) may be stacked above and/or below the laterally disposed string bodies 202A-D and similarly surrounded by multilayered memory film structures and patterned transistor gate structures. Strings in each layer having alternating orientations are connected, respectively, to bit line pads 231A, 231B, which in turn are connected to bit lines through vertical contacts (not shown). In addition, each string includes self-aligned string select line transistor gates 210A-210D located on respective bit line ends of each string, a plurality of cell transistor gates 208A-208D connected to word lines WL0 to WLn, and ground select transistor gates 209A, 209B located on respective source line ends of each string and connected to ground select lines GSL0, GSL1. In this configuration, the cells defined by the cell transistor gates 208A-208D in each string are connected in series between a source line contact 240A-D and a corresponding self-aligned string select line transistor gates 210A-D so that a drain terminal of the string cells is connected across the self-aligned string select line transistor gates 210A-D to a corresponding bit line pad 231A, 231B while the source terminal of the string cells is connected across the ground select transistors 209A, 209B to the source line contacts 240A-D. By connecting multiple strings (e.g., String A and String C) to a shared bit line pad (e.g., 231A), the strings may be oriented to share a bit line (e.g., BL0), while other strings (e.g., String B and String D) connected to a second shared bit line pad (e.g., 231B) are oriented to share a different bit line (e.g., BL1). In selected embodiments, each bit line pad 231A, 231B may be formed with a patterned polysilicon layer that is doped with n-type impurities to be in permanently conductive state, while all other string regions, such as the channel regions covered by the transistor gates and the source/drain regions between transistors, may or may not be in a permanently conductive state. In the latter case, their conductivity may be controlled by the transistor gates, though the transistor source/drain regions may doped with impurities to be in a conductive state. With the self-aligned string select line transistor gates 210A-D, cell transistor gates 208A-208D, and ground select transistor gates 209A, 209B connected respectively to the string select lines, word lines and ground select lines, each cell can be selected and turned on by signals applied to these lines.

Turning now to FIG. 7B, there is shown a simplified circuit schematic diagram representation 200B illustrating the electrical connectivity of a single layer from the multiple stacked layers in the vertical gate NAND flash memory cell array shown in FIG. 7A. In the circuit schematic diagram representation 200B, the corresponding functions of each element shown in FIG. 7A are shown with conductive line interconnections in FIG. 7B represented as dashed lines. For example, the dashed line interconnections associated with bit line BL0 represent one or more metal lines (for example, aluminum or copper) formed in one or more interconnect levels located above the stacked cell layers which are electrically connected to each respective node in the cell layers as indicated through vertical via contacts. In similar fashion, the dashed line interconnections for the source lines SL also run as one or more conductive interconnect lines that are connected to the source nodes of the strings through source contacts 240A-240D so that the source node of a first string (e.g., String A) is connected through a source contact 240A to the source nodes of all other strings vertically stacked with the first string.

Figure 8:
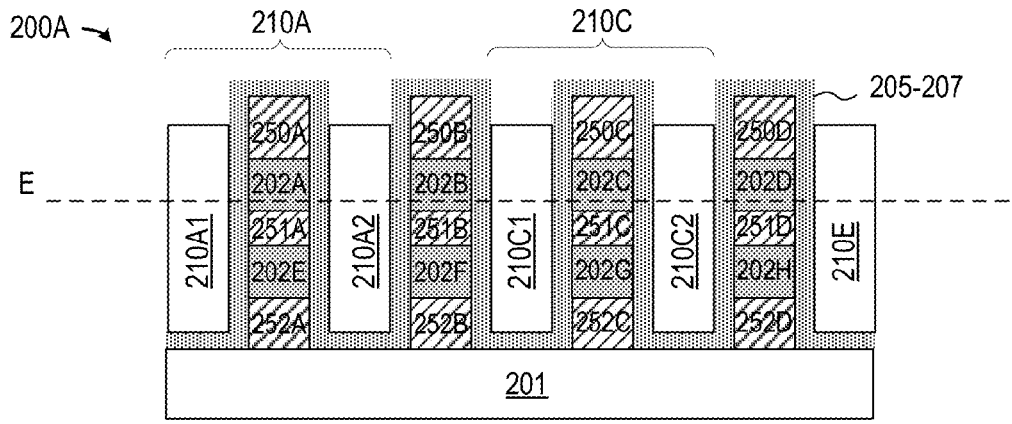
FIG. 8 illustrates a partial cross-sectional view of the vertical gate NAND flash memory structure shown in FIG. 7A at a string select line location.

To provide additional details for better understanding selected embodiments of the present disclosure, reference is now made to FIG. 8 which illustrates a partial cross-sectional view of the vertical gate NAND flash memory structure 200A at a string select line location indicated with dashed view line A shown in FIG. 7A, which depicts a longitudinal plan view along the dashed view line E of FIG. 8. In the cross sectional view of FIG. 8, a plurality of self-aligned SSL gates 210A, 210C, 210E are formed around a plurality of string stacks, each of which includes two layers of strings stacked vertically on top of each other. For example, a first string stack includes stacked semiconductor string body layers 202A, 202E which are separated from one another by top and bottom isolating strip layers 250A, 251A, 252A. In similar fashion, a second string stack includes stacked semiconductor string body layers 202B, 202F separated from one another by top and bottom isolating strip layers 250B, 251B, 252B, a third string stack includes stacked semiconductor string body layers 202C, 202G separated from one another by top and bottom isolating strip layers 250C, 251C, 252C, and so on. Thus formed, the semiconductor string body layers 202A-D, 202E-H in different layers are vertically isolated from each other by isolating strips 251A-251D. In addition, the lower semiconductor string body layers 202E-202H are isolated from the chip substrate 201 by isolating layers 252A-252D, which may have be patterned strips or may instead by formed as an unpatterned blank isolating layer (not shown) covering the chip substrate 201. The upper semiconductor string body layers 202A-D are shown as being covered by top isolating strips 250A-250D, though the topmost isolating strips may not be included in other embodiments. Each of the semiconductor string body layers may be formed with one or more patterned layers of semiconductor material, such as polysilicon, while the isolating strip layers may be formed with one or more patterned layers of dielectric material, such as silicon oxide.

Around each string stack, a multilayered thin memory film 205-207 is formed, such as by sequentially forming a tunnel dielectric layer, the charge storage layer, and the blocking dielectric (or coupling dielectric) layer over the plurality of string stacks. While the multilayered thin memory film 205-207 may be formed as a continuous non-patterned layer, such as by using SONOS-type charge trapping NAND cells, in other embodiments, the multilayered thin memory film 205-207 may be formed as a plurality of patterned layers using other materials to make floating gate cells or other memory film structures.

Self-aligned string select line gate structures 210A, 210C, 210E are located around alternating string stacks, with each self-aligned SSL gate being formed with two spatially separate gate elements, each of which is located between two adjacent string stacks and is electrically isolated from adjacent SSL gate elements by said string stacks. Thus, a first self-aligned SSL gate structure 210A includes a pair of SSL gate elements 210A1 and 210A2 formed adjacent to a first string stack 252A/202E/251A/202A/250A and surrounding multilayered thin memory film 205-207, thereby forming a first stacked SSL structure which includes String A. In addition, a third self-aligned SSL gate structure 210C includes a pair of SSL gate elements 210C1 and 210C2 formed adjacent to a third string stack 252C/202G/251C/202C/250C and surrounding multilayered thin memory film 205-207, thereby forming a third stacked SSL structure which includes String C. Between the first and third stacked SSL structures, there is located a second string stack 252B/202F/251B/202B/250B and surrounding multilayered thin memory film 205-207. By virtue of having an opposite orientation (not apparent from FIG. 8), the self-aligned SSL gates 210A2, 201C1 formed around the second string stack 252B/202F/251B/202B/250B at this location do not provide any effective string select function because they are positioned along the second string stack between the source line contact 240B and the peripheral end of the string extension region 232B for the second string stack to half-select the string extension region 232B, as shown in FIGS. 7A-B. Referring back to FIG. 7A, any potential "half selection" of a string body in the second string stack (caused when the first self-aligned SSL gate structure 210A for the first string stack is turned ON) is prevented by positioning the source line contact 240B for the second string stack so that the half-selected portion 232B of the second string stack does not affect the electrical performance of the second string stack. In selected embodiments, the self-aligned SSL gate structures 210A, 210C, 210E are formed by depositing one or more doped semiconductor gate layers (e.g., n-type polysilicon) to at least partially fill the areas between the string stacks, and then polishing and/or etching the semiconductor gate layer(s). However formed, the self-aligned SSL gate structures 210A, 210C face both sidewalls of each stacked string body (e.g., 202A, 202E) and their adjacent memory films 205-207 to form dual gate transistor structures in each string body.

Figure 9:
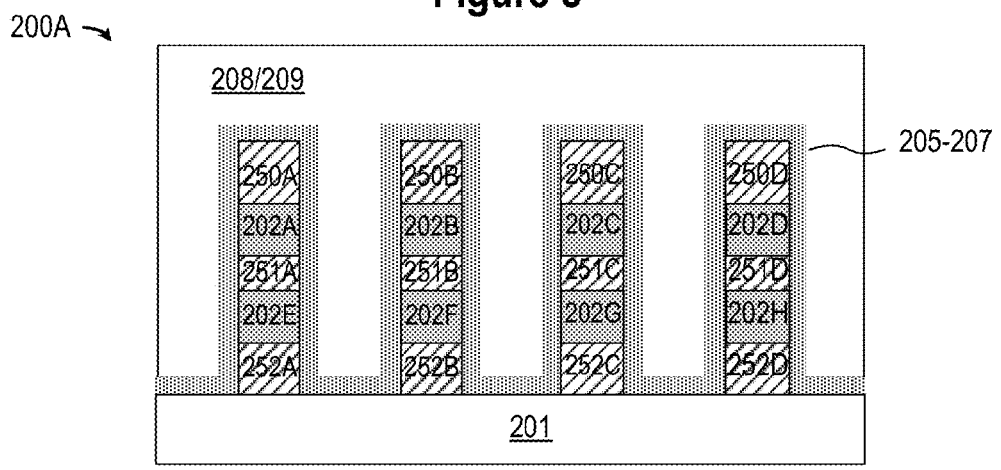
FIG. 9 illustrates a partial cross-sectional view of the vertical gate NAND flash memory structure shown in FIG. 7A at a shared word line or ground select line location.

To provide additional details for better understanding selected embodiments of the present disclosure, reference is now made to FIG. 9 which illustrates a partial cross-sectional view of the vertical gate NAND flash memory structure 200A at a shared word line or ground select line location indicated with dashed view line B or C shown in FIG. 7A. In the cross sectional view of FIG. 9, the same plurality of string stacks 202A-H, 250A-D, 251A-D, 252A-D and surrounding multi-layered thin memory film 205-207 are shown as being formed over the substrate 201, but at the shared word line location, a single word line gate structure 208 is formed on the multi-layered memory film structure 205-207 to extend across multiple strings. Likewise, at the at the ground select line location, the ground select line gate structure 209 is formed on the multi-layered memory film structure 205-207 to extend across multiple strings. In selected embodiments, the shared gate structure 208, 209 is formed by depositing one or more doped semiconductor gate layers (e.g., n-type polysilicon) to completely cover the plurality of string stacks so that the semiconductor gate layers 208, 209 form a continuous conductive line along the word line (or GSL line) direction. In the case of a cell transistor in a string at one of the word line locations, each side of the dual gate structure is connected through the shared gate structure 208 to the same common word line node, and is thus controlled at the same time so that both sides of the dual gate belong to the same transistor. Likewise, in the case of a GSL transistor in a string at the ground select line location, each side of the dual gate structure is connected through the shared gate structure 209 to the same common GSL line node, and is thus controlled at the same time so that both sides of the dual gate belong to the same transistor.

Figure 10:
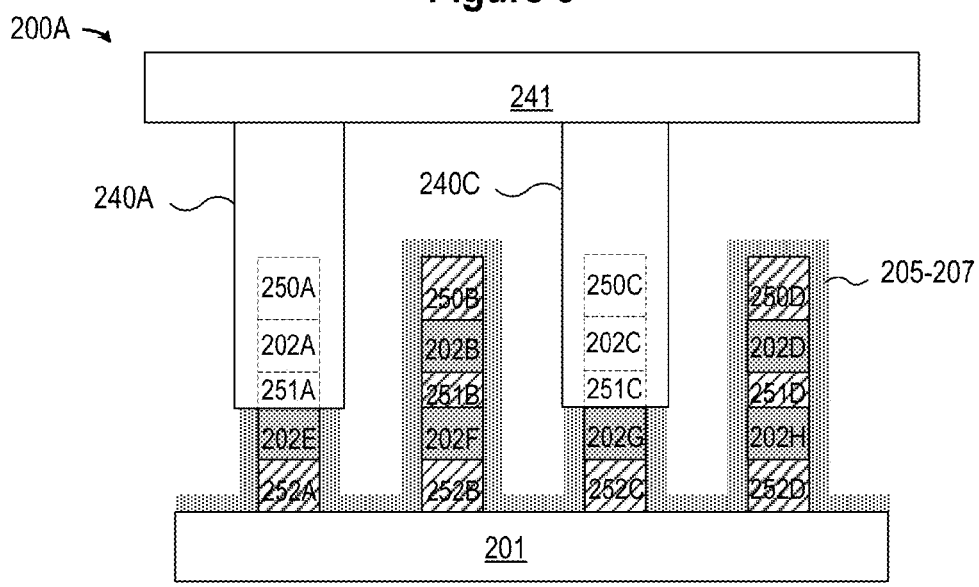
FIG. 10 illustrates a partial cross-sectional view of the vertical gate NAND flash memory structure shown in FIG. 7A at a source contact location.

To provide additional details for better understanding selected embodiments of the present disclosure, reference is now made to FIG. 10 which illustrates a partial cross-sectional view of the vertical gate NAND flash memory structure 200A at a source contact location indicated with dashed view line D shown in FIG. 7A. In the cross sectional view of FIG. 10, the source contacts 240A, 240C are formed to electrically connect the string bodies (e.g., 202A, 202E, 202C, 202G) in the first and third stacked strings to a metal source line 241. As will be appreciated, the positioning of the source contacts 240A, 240C in the first and third stacked strings creates an electrical connection between the source contacts 240A, 240C and strings of all layers, such that the source contact 240A establishes an electrical connection between the source line and strings 250A, 251A and the source contact 240C establishes an electrical connection between the source line and strings 250C, 251C. In selected embodiments, the source contacts 240A, 240C are formed by patterning and etching via or contact openings through one or more interconnect layers to expose the lower layer string bodies (e.g., 202E, 202G) and then filling the openings with one or more conductive layers (e.g., metal), either prior to or as part of the metal deposition process used to form the metal source line 241. As will be appreciated, other source contact structures may be formed to electrically connect the stacked strings to a metal source line 241.

Figure 11:
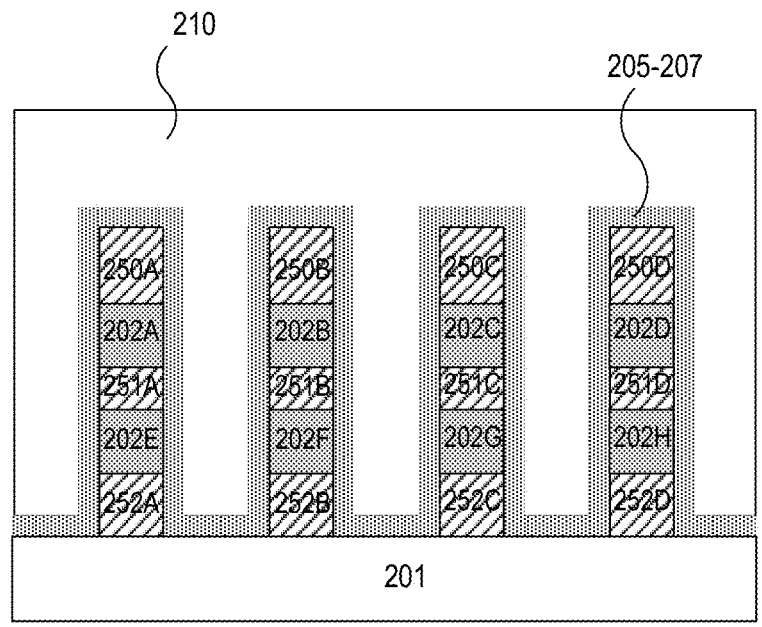
FIGS. 11-12 show cross-sectional views of an example semiconductor device during successive phases of a fabrication sequence for forming shared word line or ground select line structures and self-aligned string select structures in a vertical gate NAND flash memory in accordance with selected embodiments of the present disclosure.

In accordance with selected embodiments of the present disclosure, SSL gates may be formed as island-shaped or recessed gates that are confined to the space between adjacent strings on first and second peripheral ends of a plurality of NAND strings having alternating or opposed string orientations. For example, the SSL gate structure 210A shown in FIG. 7A may be formed around a first string stack 252A/202E/251A/202A/250A with adjacent SSL gates 210A1 and 210A2 that are separated laterally from each other by the first string stack. Such two-part gate structures may readily be fabricated using self-alignment processing techniques which are integrated with the fabrication process used to form the shared word line or ground select line gates. To illustrate an example fabrication sequence, reference is now made to FIGS. 11-12 which show cross-sectional views of an example semiconductor device during successive fabrication steps for forming shared word line or ground select line structures and self-aligned string select structures in a vertical gate NAND flash memory. In particular, FIG. 11 shows a first example cross-sectional view at a string select line location at a first stage after forming a first continuous conductive gate electrode structure 210 to completely cover the plurality of string stacks 202A-H, 250A-D, 251A-D, 252A-D at an intermediate stage by depositing one or more doped semiconductor gate layers (e.g., n-type polysilicon). By patterning the first continuous conductive gate electrode structure 210 with an appropriate mask and etch sequence, separate gate electrode structures may be defined over the word line 208A-D and ground select line 209A, B locations in addition to the SSL locations 210A, B, all of which have the same cross-sectional structure as shown in FIG. 11. As a result, the word line and ground select line gates (such as shown in FIG. 9) are formed at this intermediate stage of fabricating the self-aligned string select structures, and may optionally be protected or masked off from subsequent processing before completing the fabrication of the self-aligned string select structures.

Figure 12:
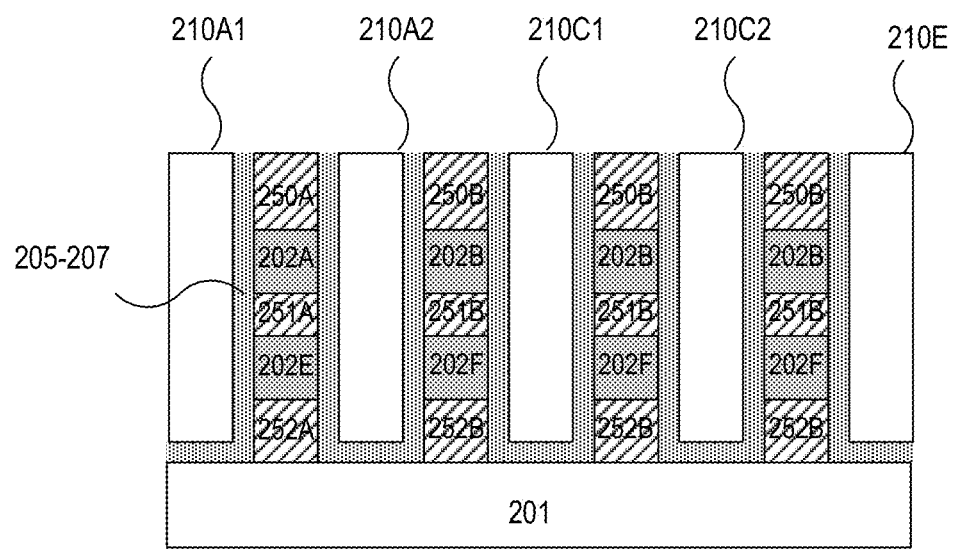

Insofar as the individual SSL gate nodes 202A-H in the string stacks are not yet isolated from each other when connected to the first continuous conductive gate electrode structure 210 depicted in FIG. 11, one or more etch and/or planarization processes may be applied to provide node isolation between adjacent island SSL gate elements. For example, FIG. 12 illustrates processing of the semiconductor device subsequent to FIG. 11 after a selective etch and/or planarization process (e.g., chemical mechanical polish) is used to etch back or otherwise planarize the first continuous conductive gate electrode structure 210 from the top of the string stacks without removing the materials used to form the string stacks 202A-H, 250A-D, 251A-D, 252A-D or the surrounding multilayered thin memory film 205-207. As a result of the planarization process shown in FIG. 12, the SSL gate elements 210A1-2, 210C1-2, 210E1 are recessed relative to, and electrically isolated by, the string stacks. If desired, an additional recess etch process may be applied to selectively recess the tops of the SSL gate elements 210A1-2, 210C1-2, 210E1 below the string stacks. In other embodiments where the planarization process was applied to the entirety of the first continuous conductive gate electrode structure 210 without selective protection or masking, an additional interconnection process may be used for reconnecting the gate electrodes for the word line and ground select line gate electrodes.

As disclosed herein, the formation and placement of recessed SSL gate electrodes on opposite ends of interleaved strings with alternating alignments allows only the SSL gates which belong to a selected string to be turned on during read and program operations for the selected string without also half-selecting adjacent strings, despite the fact that recessed SSL gates are placed between the two adjacent strings. This targeted selection of strings may be illustrated with reference to FIG. 7A where String A has string select island-type gates 210A1 and 210A2 formed on each side of the string and commonly controlled to form the common gate node of the SSL transistor 210A. Insofar as the SSL gate element 210A2 is shared by two adjacent strings (String A and String B), this adjacent positioning with conventional NAND string arrangements could lead to undesirable "half-selection" of the adjacent String B when the SSL transistor for String A is turned on. However, the half-selection problem may be avoided in accordance with selected embodiments of the present disclosure by placing island SSL gates between two strings of opposite directional orientation (e.g., even and odd) so that the SSL gates function as select transistors in one of the strings, but not the other. For example, FIG. 7A depicts an example inter-string SSL gate arrangement wherein a plurality of alternating string alignments (e.g., even/odd) are used to interleave strings of opposite orientation between island SSL gates so that each string includes a selection end and a dangling string end. The selection end is located on the drain side of the string between the string transistor cells and the bit line node, and is disposed between the island SSL gates for that string, whereas the dangling string end is located on the source side of the string and extends through and past island SSL gates for an adjacent string having an opposite orientation.

In selected embodiments, each string (e.g., String A 261) may be spatially divided by the source contact 240A into a first region (which is located between the bit line node 231A and the source contact 240A), and a stub or extension region 232A (which is located on the opposite side of the source contact 240A). The first region is electrically connected to the bit line node 231A on one end and to the source line node 240A on the other end. The string extension region 232A is electrically connected to the source line node 240A at one end, but the other end is electrically floating. By interleaving a plurality of such strings with alternating orientations so that strings having opposite orientation are adjacent to one another, the island SSL gates 210A, 210B, 210C, 210D may be positioned in the first region of each string between the string transistor cells 208 (or ground select line 209) and the bit line node 231, thereby forming island SSL gates on opposite ends of opposed strings to achieve individual string selection.

With this arrangement, each string select transistor (e.g., 210A) achieves its function of selecting an individual string (e.g., String A 261) by either enabling or interrupting an electrical path which extends from the bit line node (e.g., 231A) to the source line node (e.g., 240A) of said string. For example, during read operation, the string select transistor 210B for selected String B acts as a turned-on pass transistor which enables the continuous conducting string channel extending from the bit line node 231B to the cell in String B to be read. However, a string select transistor (e.g., 210A, 210C) in an unselected string acts as a turned-off pass transistor which cuts off any conductive string channel so that no string current can pass during read operation. During program operation, the string select transistor (e.g., 210B) for a selected string (e.g., String B) is gated with a bias voltage (e.g., Vcc) to either connect the string channel electrically to the bit line node 231B or to cut it off electrically from the bit line node 231B, depending on the data bit stored in the bit line. At the same time, the string select transistors (e.g., 210A, 210C) of unselected strings are turned off so that the string channels are floating during program operation.

As understood from the foregoing, the electrical function of each string select transistor only affects the electrical state of a string if the SSL gate is located between the bit line node and the source line node of said string. Conversely, it is seen that the placement of an SSL gate along the string extension region will have no impact on the string during read or program operation since the electrical state (e.g., conductivity, channel voltage, etc.) of a string or any of its elements (such as transistor cells, string channel, etc.) is not influenced by the electrical state of the string extension. This results from the fact that the source node contact 240 is located between the first region of the string and the second region of the string (string extension) and electrically clamped to a defined voltage (e.g., 0V) during read or program operation to effectively decouple the two string regions electrically from each other. Accordingly, island SSL gates may be located on opposite ends of each string with each island SSL gate being spatially located between adjacent strings of opposite orientation, provided that only one of the SSL gates is positioned to select one of the two strings, while the other SSL gate is positioned to as a gate for the non-functional string extension for the other string.

Figure 13:
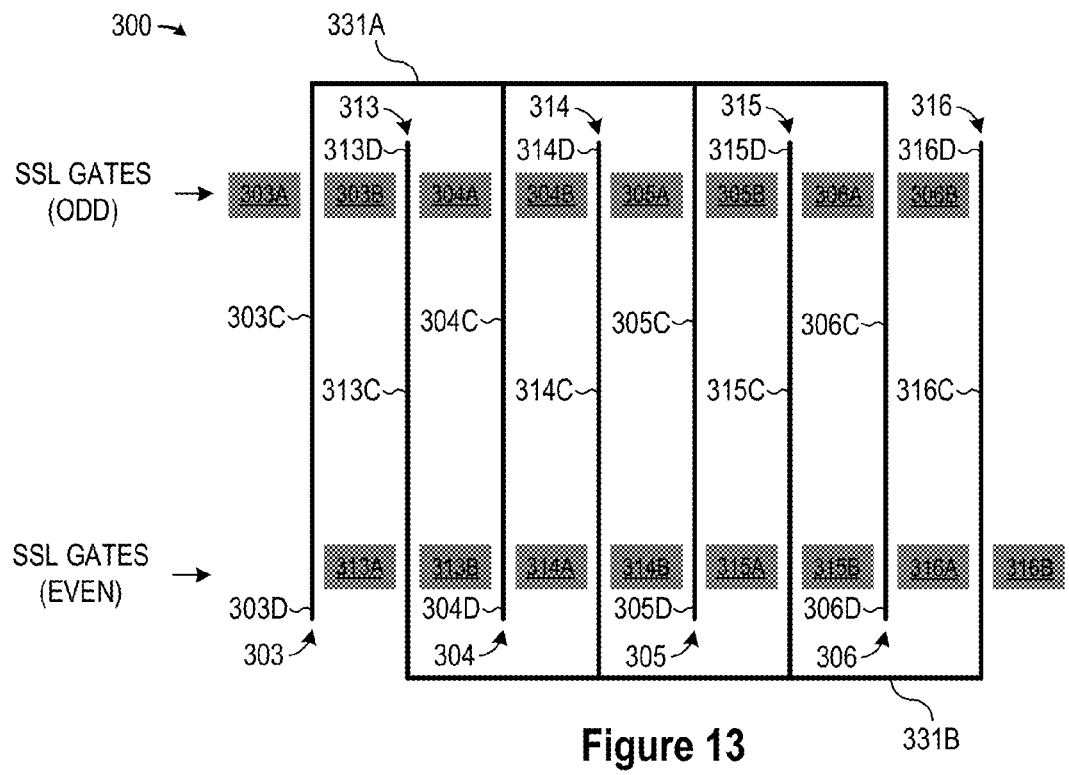
FIG. 13 illustrates a simplified schematic representation of a first alternating string structure using an even-odd memory string orientation with self-aligned string select structures positioned to define string stub and extension portions.

As will be appreciated, a variety of different alternating string structures may be used in combination with the paired placement of island or self-aligned SSL gates on opposite ends of each string to enable individual string selection. For example, FIG. 13 illustrates a simplified schematic representation of a first alternating string structure 300 using an even-odd memory string orientation with self-aligned string select structures 303-306, 313-316 positioned to define string stub and extension portions. As illustrated, a first plurality of "even" strings 303-306 connected to a shared bit line pad or node 331A are arranged to extend "down" to be interleaved with a second plurality of "odd" strings 313-316 connected to extend "up" from a shared bit line pad or node 331B in an alternating even-odd configuration. Each string includes a pair of island SSL gates 303A/B, 313A/B, 304A/B, 314A/B, 305A/B, 315A/B, 306A/B, 316A/B which are located on the string's selection end near its bit line node 331A/B so that island SSL gates are located between all adjacent strings and so that each string includes a string extension portion extending through and past island SSL gates for an adjacent string having an opposite orientation. Thus, a first string 303 includes a first functioning region 303C along which its island SSL gates 303A/B are formed, and second non-functional string extension region 303D which extends through and past island SSL gates 313A/B for adjacent string 313 having an opposite orientation. In similar fashion, each of the strings 304-306 includes a first functioning region 304C, 305C, 306C along which its island SSL gates 304A/B, 305A/B, 306A/B are formed, and second non-functional string extension region 304D, 305D, 306D which extends through and past island SSL gates 314A/B, 315A/B, 316A/B for adjacent string having an opposite orientation. For the interleaved second plurality of strings 313-316, each string also includes island SSL gates 313A/B, 314A/B, 315A/B, 316A/B formed along a first functioning region 313C, 314C, 315C, 316C, and second non-functional string extension region 313D, 314D, 315D, 316D which extends through and past island SSL gates 303A/B, 304A/B, 305A/B, 306A/B for adjacent strings 303-306 having an opposite orientation.

Figure 14:
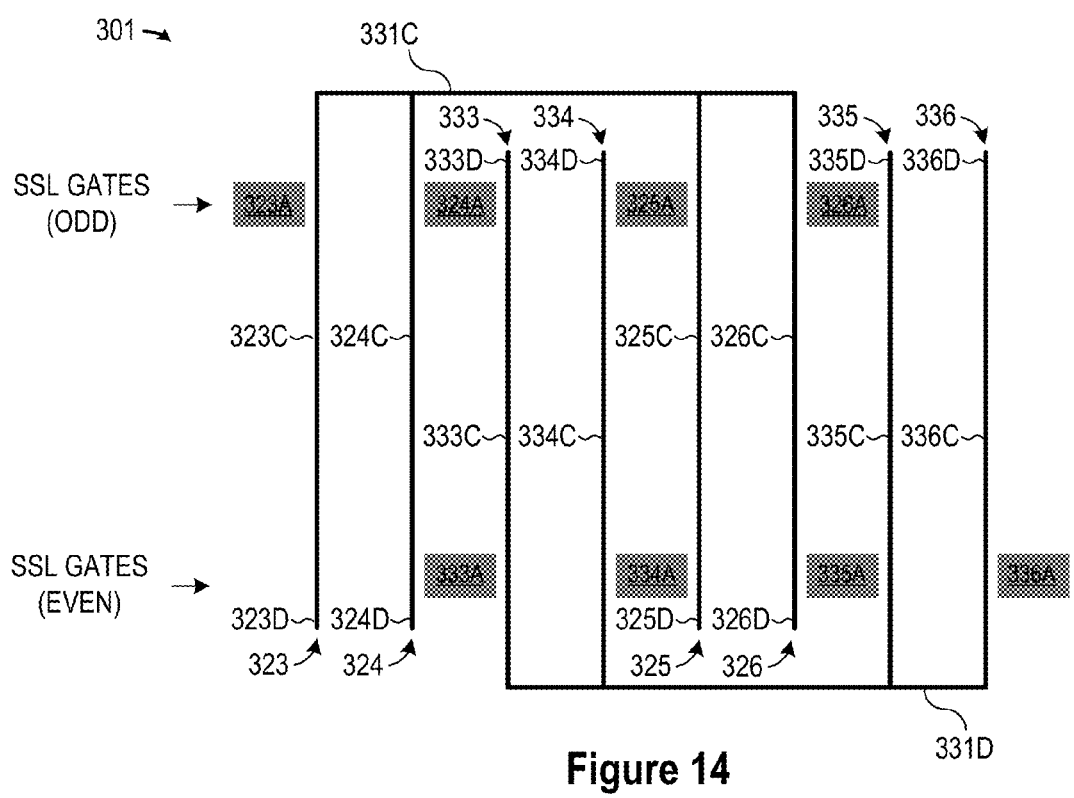
FIG. 14 illustrates a simplified schematic representation of a second alternating string structure using an even-even-odd-odd memory string orientation with self-aligned string select structures positioned to define string stub and extension portions.

Another example alternating string structure is shown in FIG. 14, which illustrates a simplified schematic representation of a second alternating string structure 301 using an even-even-odd-odd memory string orientation with self-aligned string select structures 323A, 324A, 325A, 326A, 333A, 334A, 335A, 336A positioned to define string stub and extension portions. As illustrated, "even" strings 323-326 connected to a shared bit line pad or node 331C are arranged in adjacent pairs to extend "down" to be interleaved with adjacent pairs of "odd" strings 333-336 connected to extend "up" from a shared bit line pad or node 331D in an alternating even-even-odd-odd configuration. Each string includes a single island SSL gate 323A, 324A, 325A, 326A, 333A, 334A, 335A, 336A which is located on the string's selection end near its bit line node 331C/D so that island SSL gates are located only between all adjacent strings having opposite orientation and so that each string includes a string extension portion extending through and past an island SSL gate for an adjacent string having an opposite orientation. For example, a first string 324 includes an island SSL gate 324A formed along a first functioning region 324C, and second non-functional string extension region 324D which extends through and past island SSL gates 333A for adjacent string 333 having an opposite orientation. In similar fashion, each of the strings 323, 325-326 includes a first functioning region 323C, 325C, 326C along which its island SSL gates 323A, 325A, 326A are formed, and second non-functional string extension region 323D, 325D, 326D which extends through and past island SSL gates 335A, 336A for adjacent strings having an opposite orientation. For the interleaved "odd" strings 333-336, each string also includes island SSL gates 333A, 334A, 335A, 336A formed along a first functioning region 333C, 334C, 335C, 336C, and second non-functional string extension region 333D, 334D, 335D, 336D which extends through and past island SSL gates 323A, 324A, 325A, 326A for adjacent strings 323-326 having an opposite orientation.

Figure 15:
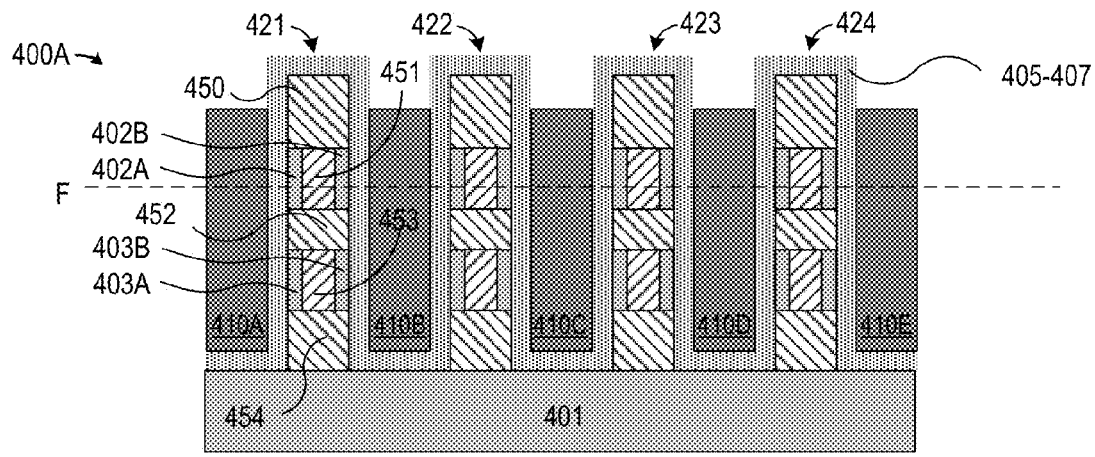
FIG. 15 illustrates a partial cross-sectional view of a vertical gate NAND flash memory having stacked strings formed with thin silicon body sidewall layers in accordance with selected embodiments of the present disclosure.

As will be appreciated, the alternating string structure arrangements shown in FIGS. 13-14 may be implemented with a single layer of interleaved NAND strings or with multiple layers of interleaved NAND strings such that a plurality of NAND string stacks are interleaved with adjacent NAND string stacks having alternating orientations. For example, the even-even-odd-odd alternating string structure 301 shown in FIG. 14 may be implemented with a first vertical cell structure where each string 323-326, 333-336 is replaced with a NAND string stack that includes multiple layers of vertically stacked strings isolated from one another by isolating dielectric layers and surrounded by a multilayered thin memory film. However, the even-even-odd-odd alternating string structure may also be embodied in other vertical cell structures. For example, FIG. 15 illustrates a partial cross-sectional view 400A of a vertical gate NAND flash memory having vertical cell structures 421-424 formed over a substrate 401, where each vertical cell structure includes stacked strings of thin silicon body sidewall layers in each layer. In the depicted vertical gate NAND flash memory 400A, a plurality of self-aligned SSL gates 410A, 410B, 410C, 410D, 410E are formed around the vertical string stack structures 421-424. Each vertical string stack structure is a fin-shaped stack of isolated string body layers having a shared orientation, where each stack is surrounded by a multi-layered memory film structure 405-407 and runs in a first direction horizontal to the chip surface 401. For example, a first vertical string stack structure 421 includes a pair of thin semiconductor string body layers (e.g., 402A, 402B) on each layer which are vertically stacked with a pair of thin semiconductor string body layers (e.g., 403A, 403B) on another layer. In each layer, the thin semiconductor string body layers 402 A/B, 403 A/B are physically separated and electrically isolated from one another by a dielectric layer 451, 453. In addition, top and bottom isolating strip layers 450, 452, 454 are formed above and below each string layer to provide isolation between different string layers. Additional vertical string stack structures 422-424 may be formed with the same structure wherein thin semiconductor string body layers 402 A/B, 403 A/B are isolated by alternating dielectric layers 450-454. While only four fin-shaped vertical structures 421-424 are shown, any number of fins may be used in the VG NAND device with varying numbers of layers as determined based upon the needs of the end user, characteristics of the materials used for the device, and/or manufacturing process or the device.

As shown in FIG. 15, each vertical string stack structure 421-424 may be formed on the silicon chip substrate 401 with alternating layers of dielectric and semiconductor string material to define thin semiconductor string body layers 402 A/B, 403 A/B on each layer. In an example embodiment, the top and bottom isolating strip layers 450, 452, 454 may be formed with a first dielectric material, such as silicon nitride, while the isolating dielectric layers 451, 453 may be formed with a second dielectric material, such as a doped or undoped low-k dielectric (e.g., silicon oxide). As formed, the sidewalls of the isolating dielectric layers 451, 453 may be laterally recessed relative to the sidewalls of the top and bottom isolating strip layers 450, 452, 454 so that, on each recessed vertical sidewall of the isolating dielectric layers 451, 453, a thin sidewall string layer 402 A/B, 403 A/B may be formed with a suitable semiconductor material (e.g., silicon film) so that the outer surface of the thin sidewall string layer 402 A/B, 403 A/B does not protrude relative to the sidewall surface of the isolating strip layers 450, 452, 454. Each vertical string stack structure 421-424 may be covered by a multilayered thin memory film 405-407 for charge storage which includes a tunnel dielectric 405, a charge trap layer 406, and a coupling dielectric layer 407. On the sides of each vertical string stack structure 421-424, self-aligned conductive gate elements 410A-E are formed as one or more recessed layers of conductive material (e.g., doped polysilicon) which do not fill the entire space between the fins, but may form a line structure running in a second horizontal direction which is perpendicular to the first horizontal direction. Depending on the orientation of the thin sidewall string layers 402 A/B, 403 A/B in a given vertical string stack structure 421-424, the self-aligned conductive gate elements 410A-E may form the SSL gates of the memory device.

While any desired fabrication sequence may be used to form the vertical string stack structures 421-424, the manufacturing process may include an initial step of forming a dielectric stack of alternating different layers 450-454 over a substrate 401, including silicon nitride layers 450, 452, 454 and silicon oxide layers 451, 453. After patterning and etching the dielectric stack, a plurality of multilayer dielectric fin structures may be defined, such as by applying an anisotropic reactive ion etch (RIE) process. Subsequently, the sidewall surfaces of alternating silicon oxide layers 451, 453 may be etched back or recessed relative to the silicon nitride layers 450, 452, 454 by applying a selective wet or dry etch process, such as selective isotropic RIE, thereby forming multilayer dielectric fin structures with alternating recessed sidewall patterns. By depositing one or more semiconductor layers (e.g., polysilicon) to completely cover the multilayer dielectric fin structures, the alternating recessed sidewall patterns are filled with the deposited semiconductor material so that a directional semiconductor etch process may be applied to remove the deposited semiconductor material except for the locations masked by the protruded sidewalls of silicon nitride layers 450, 452, 454, thereby defining the thin sidewall string layers 402 A/B, 403 A/B.

Figure 16:
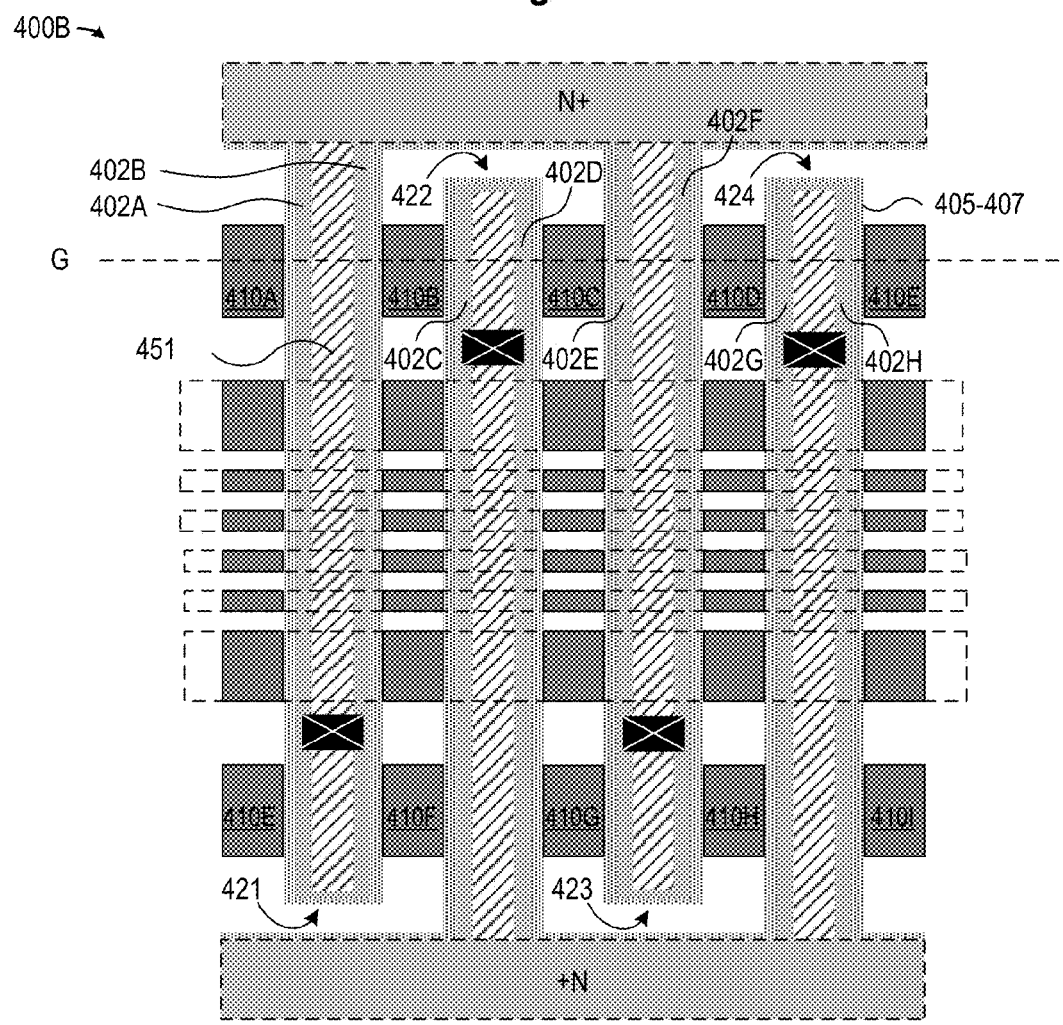
FIG. 16 illustrates a partial plan view of a vertical gate NAND flash memory cell array shown in FIG. 15.

To provide additional details for better understanding selected embodiments of the present disclosure, reference is now made to FIG. 16 which illustrates a partial plan view 400B of the vertical gate NAND flash memory structure 400A along dashed view line F shown in FIG. 15. Conversely, FIG. 15 shows a vertical cross section along dashed view line G in FIG. 16. As seen from the plan view 400B, each vertical string stack structure 421-424 includes thin polysilicon films 402A/B, 402C/D, 402E/F, 402G/H along the sidewalls of insulating structures 451 so that each layer in a string stack contains two separate outward facing strings (e.g., 402 A/B), instead of one string with two outward faces (dual gate structure) as shown in FIG. 7A. As a result of forming each vertical string stack structure (e.g., 421) with a pair of thin semiconductor string body layers 402A, 402B on each layer, the string body layers 402A, 402B have the same orientation. By the same token, the adjacent vertical string stack structure (e.g., 422) is formed with a pair of thin semiconductor string body layers 402C, 402D on each layer having an opposed orientation. With this alternating layout of paired string body layers, the self-aligned SSL gate structures 410A-E formed between the vertical string stack structures may be used to control individual string body layers, depending on the string orientation. For example, a first vertical string stack structure 421 includes a first string body layer 402A which is controlled by a first self-aligned SSL gate structure 410A, and also includes a second string body layer 402B which is controlled by a second self-aligned SSL gate structure 410B. However, the second self-aligned SSL gate structure 410B does not control the string body layer 402C in the second vertical string stack structure 422 because of its position along the string extension region of the second vertical string stack structure 422. Instead, the string body layer 402C in the second vertical string stack structure 422 is controlled by the self-aligned SSL gate structure 410F. In similar fashion, the string body layers 402E and 402F are controlled, respectively, by the self-aligned SSL gate structures 410C and 402D, while the string body layers 402C, 402D, 402G, and 402H are controlled, respectively, by the self-aligned SSL gate structures 410F, 410G, 410H, and 410I.

By now it should be appreciated that there is provided herein a three-dimensional integrated circuit non-volatile memory device wherein alternating NAND string stacks may be separately selected by using self-aligned string select line (SSL) gates that are positioned on first and second peripheral ends of a plurality of NAND strings having alternating or opposed string orientations. The disclosed memory device includes a memory array having first and second NAND memory cell strings with opposite orientations. The memory array may include a first plurality of vertically stacked NAND memory cell strings and a second plurality of vertically stacked NAND memory cell strings. The first plurality of vertically stacked NAND memory cell strings includes the first NAND memory cell string and are connected between a first shared source line contact and a first shared string select line gate electrode embodying the second string select line gate electrode of the first NAND memory cell string. The second plurality of vertically stacked NAND memory cell strings include the second NAND memory cell string and are connected between a second shared source line contact and a second shared string select line gate electrode embodying the second string select line gate electrode of the second NAND memory cell string. In some embodiments, the first NAND memory cell string may have a first bit line end-to-source line end orientation, while the second NAND memory cell string that is adjacent to the first NAND memory cell string has a second, opposite bit line end-to-source line end orientation. In other embodiments, each NAND memory cell string is a vertical gate NAND memory cell string formed with a semiconductor strip having word line gate conductors formed around the semiconductor strip to define memory cells running parallel to an upper surface of an underlying substrate. In still other embodiments, each NAND memory cell string is a vertical gate NAND memory cell string having a thin film semiconductor strip formed on a sidewall of a recessed dielectric layer with a plurality of word line gate conductors formed around an outside face of the thin film semiconductor strip to define a plurality of memory cells running parallel to an upper surface of the underlying substrate. Each NAND memory cell string includes transistors (e.g., memory cell transistors and a ground select transistor connected in series between the string select transistor and the memory cell transistors) and a source line contact which are connected in series between a bit line and string extension region of the NAND memory cell string which extends from the source line contact and past a first string select line gate electrode located on a peripheral end of the NAND memory cell string. In addition, a second string select transistor that is formed with a second string select line gate electrode is connected in series between the bit line and the plurality of transistors. As formed, the first and second string select line gate electrodes are shared between adjacent NAND memory cell strings having opposite orientations. In selected embodiments, the first and second string select line gate electrodes are each formed as a pair of self-aligned string select line gate electrodes formed between and shared by adjacent NAND memory cell strings having opposite orientations. In other embodiments, the first and second string select line gate electrodes are each formed as a self-aligned string select line gate electrode formed between and shared by adjacent NAND memory cell strings having opposite orientations. In this way, the string select line gate electrodes are each completely confined laterally in a space between said two adjacent NAND memory cell strings having opposite orientations. In selected embodiments, the first string select line gate electrode on the first NAND memory cell string is laterally aligned with the second string select line gate electrode of the second NAND memory cell string.

In another form, there is provided a NAND Flash memory cell array and associated method of manufacture and operation. The disclosed array includes a plurality of strings, and may include two or more vertically stacked strings which are running in a direction horizontal to a substrate surface on which the memory cell array is formed. Each string includes a plurality of series-connected cell transistors having gates connected to corresponding word lines, first and second string select transistors having first and second self-aligned gates connected, respectively, to first and second string select lines, a source line contact connected to a source line, and a ground select transistor having a gate connected to a ground select line. Each string also has a bit line end-to-source line end orientation which extends from a corresponding bit line and source line contact to extend past the corresponding source line contact to form an electrically floating string section, such that the first string select transistor is connected between the corresponding bit line and the plurality of series-connected cell transistors, and the second string select transistor is positioned along the electrically floating string section. In selected embodiments, each string is a polysilicon sidewall film formed on a sidewall of a vertical dielectric structure. As a result, each string has first and second portions. The first string portion is located on a first side relative to the second string select transistor and contains the entirety of plurality of series-connected cell transistors, the first string select transistor, the source line contact, and the ground select transistor. The second string portion is located on a second side relative to the second string select transistor and contains no transistors, bit line node or source line contact. As formed, the first and second strings having opposite bit line end-to-source line end orientations are placed adjacent to on another such that the first string select transistor of the first string is adjacent to the second string select transistor of the second string such that the first self-aligned gate of the first string select transistor and the second self-aligned gate of the second string select transistor share a common self-aligned gate electrode that is completely confined laterally in a space between the first and second strings. In selected embodiments, the first and second self-aligned gates are each formed as a pair of self-aligned string select line gate electrodes located between and shared by adjacent NAND memory cell strings having opposite bit line end-to-source line end orientations. In other embodiments, the first and second self-aligned gates are each formed as a self-aligned string select line gate electrode formed between and shared by adjacent NAND memory cell strings having opposite bit line end-to-source line end orientations. As formed, the first string may have a first bit line end-to-source line end orientation that is aligned with a first bit line node in a first direction and a first source line node in a second direction, and the second string may have a second, opposite bit line end-to-source line end orientation that is aligned with a second source line node in the first direction and a second bit line node in the second direction.

In yet another form, there is disclosed a NAND Flash memory cell array and associated method of operating same. In the disclosed NAND Flash memory cell array, there are first and second adjacent NAND memory cell strings having opposite orientations such that a bit line end of the first NAND memory cell string is proximate to a source line end of the second NAND memory cell string, and such that a bit line end of the first NAND memory cell string is proximate to a source line end of the second NAND memory cell string. In operation of the NAND Flash memory cell array, a source line contact formed on the second NAND memory cell string is biased with a first source line signal bias voltage, where the source line contact is located on the second NAND memory cell string between a plurality of memory cell transistors and a self-aligned string select transistor gate electrode formed between the first and second adjacent NAND memory cell strings as a recessed polysilicon gate electrode. In addition, the self-aligned string select transistor gate electrode is biased with a first string select signal bias voltage to select the first NAND memory cell string but not the second NAND memory cell string. In selected embodiments, the self-aligned string select transistor gate electrode is biased by applying the first string select signal bias voltage to first and second self-aligned string select transistor gate electrodes formed on opposite sides of the first NAND memory cell string as recessed polysilicon gate electrodes. In other embodiments, the self-aligned string select transistor gate electrode is biased by applying the first string select signal bias voltage to a single self-aligned string select transistor gate electrode formed between first and second adjacent NAND memory cell strings, each of which comprises a polysilicon sidewall film formed on a sidewall of a vertical dielectric structure.

Although the described exemplary embodiments disclosed herein are directed to various non-volatile memory device structures and methods for making and operating same by providing interleaved NAND string stacks having alternating orientation which may be individually selected by positioning a pair of self-aligned or island SSL gates on first and second peripheral ends of each NAND string (stack) having alternating or opposed string orientations, whereby the SSL gate positioned on the source end of the string provides no electrical function because if its location on the dangling string extension region past the source line contact, the present invention is not necessarily limited to the example embodiments which illustrate inventive aspects of the present invention that are applicable to a wide variety of fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the NAND cell transistors are described as n-channel transistors on p-type (or undoped) substrate, this is merely for illustration purposes, and it will be appreciated that n and p-type impurities may be interchanged so as to form p-channel transistors on n-type substrate, or the substrate may consist of undoped silicon. In addition, the flash memory cells are illustrated herein as being embodied as vertical gate NAND memory cell strings, but this is merely for convenience of explanation and not intended to be limiting and persons of skill in the art will understand that the principles taught herein apply to other suitable kinds of cell structures and the resulting different bias conditions. It will also be appreciated that the disclosed cell array structure with string selection scheme for read and program operations is not tied to any specific cell technology. For example, the alternating string configuration with self-aligned SSL gates may be used with VG NAND flash memory devices where strings have a floating body enclosed at both ends by regions of different conductivity type and to VG NAND flash memory devices where the string bodies are not floating. Moreover, the figures illustrate examples in which there are two stacked layers of strings, however, other embodiments are not restricted to any specific number of layers, and even work for single layer cell arrays. In addition, the terms of relative position used in the description and the claims, if any, are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," "includes," "including," "has," "having," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:
1. A non-volatile memory device, comprising:
    a memory array comprising first and second NAND memory cell strings having opposite orientations, each NAND memory cell string comprising:
        a plurality of transistors and a source line contact which are connected in series between a bit line and string extension region of said NAND memory cell string which extends from the source line contact and past a first string select line gate electrode located on a peripheral end of the NAND memory cell string, and a second string select transistor formed with a second string select line gate electrode and connected in series between the bit line and the plurality of transistors, where the first and second string select line gate electrodes are shared between adjacent NAND memory cell strings having opposite orientations.

2. The non-volatile memory device of claim 1, where the first and second string select line gate electrodes each comprise a pair of self-aligned string select line gate electrodes formed between and shared by adjacent NAND memory cell strings having opposite orientations.

3. The non-volatile memory device of claim 1, where the first and second string select line gate electrodes each comprise a self-aligned string select line gate electrode formed between and shared by adjacent NAND memory cell strings having opposite orientations.

4. The non-volatile memory device of claim 1, where each NAND memory cell string further comprises a ground select transistor connected in series between the string select transistor and the plurality of transistors.

5. The non-volatile memory device of claim 1, where the first NAND memory cell string has a first bit line end-to-source line end orientation and where the second NAND memory cell string is adjacent to the first NAND memory cell string and has a second, opposite bit line end-to-source line end orientation.

6. The non-volatile memory device of claim 5, where first string select line gate electrode on the first NAND memory cell string is laterally aligned with the second string select line gate electrode of the second NAND memory cell string.

7. The non-volatile memory device of claim 1, where the first and second NAND memory cell strings each comprise a vertical gate NAND memory cell string comprising a semiconductor strip with a plurality of word line gate conductors formed around the semiconductor strip to define a plurality of memory cells running parallel to an upper surface of an underlying substrate.

8. The non-volatile memory device of claim 1, where the first and second NAND memory cell strings each comprise a vertical gate NAND memory cell string comprising a thin film semiconductor strip formed on a sidewall of a recessed dielectric layer with a plurality of word line gate conductors formed around an outside face of the thin film semiconductor strip to define a plurality of memory cells running parallel to an upper surface of an underlying substrate.

9. The non-volatile memory device of claim 1, where the first and second string select line gate electrodes are each completely confined laterally in a space between said two adjacent NAND memory cell strings having opposite orientations.

10. The non-volatile memory device of claim 1, where the memory array comprises:
a first plurality of vertically stacked NAND memory cell strings which include the first NAND memory cell string and which are connected between a first shared source line contact and a first shared string select line gate electrode embodying the second string select line gate electrode of the first NAND memory cell string, and
a second plurality of vertically stacked NAND memory cell strings which include the second NAND memory cell string and which are connected between a second shared source line contact and a second shared string select line gate electrode embodying the second string select line gate electrode of the second NAND memory cell string.

11. A NAND Flash memory cell array with strings, each comprising a plurality of series-connected cell transistors having gates connected to corresponding word lines, first and second string select transistors having first and second self-aligned gates connected, respectively, to first and second string select lines, a source line contact connected to a source line, and a ground select transistor having a gate connected to a ground select line,
wherein each string has a bit line end-to-source line end orientation which extends from a corresponding bit line and source line contact to extend past the corresponding source line contact to form an electrically floating string section, wherein the first string select transistor is connected between the corresponding bit line and the plurality of series-connected cell transistors, and wherein the second string select transistor is positioned along the electrically floating string section; and
wherein first and second strings having opposite bit line end-to-source line end orientations are placed adjacent to on another such that the first string select transistor of the first string is adjacent to the second string select transistor of the second string such that the first self-aligned gate of the first string select transistor and the second self-aligned gate of the second string select transistor share a common self-aligned gate electrode that is completely confined laterally in a space between the first and second strings.

12. The NAND Flash memory cell array of claim 11, where the first string has a first bit line end-to-source line end orientation that is aligned with a first bit line node in a first direction and a first source line node in a second direction, and where the second string has a second, opposite bit line end-to-source line end orientation that is aligned with a second source line node in the first direction and a second bit line node in the second direction.

13. The NAND Flash memory cell array of claim 11, where each string has a first portion which is located on a first side relative to the second string select transistor and which contains the entirety of plurality of series-connected cell transistors, the first string select transistor, the source line contact, and the ground select transistor, and where each string also has a second portion which is located on a second side relative to the second string select transistor and which contains no transistors, bit line node or source line contact.

14. The NAND Flash memory cell array of claim 11, where the memory cell array comprises two or more vertically stacked strings which are running in a direction horizontal to a substrate surface on which the memory cell array is formed.

15. The NAND Flash memory cell array of claim 11, where each string comprises a polysilicon sidewall film formed on a sidewall of a vertical dielectric structure.

16. The non NAND Flash memory cell array of claim 11, where the first and second self-aligned gates each comprise a pair of self-aligned string select line gate electrodes formed between and shared by adjacent NAND memory cell strings having opposite bit line end-to-source line end orientations.

17. The NAND Flash memory cell array of claim 11, where the first and second self-aligned gates each comprise a self-aligned string select line gate electrode formed between and shared by adjacent NAND memory cell strings having opposite bit line end-to-source line end orientations.

\* \* \* \* \*